United States Patent
Kim et al.

(10) Patent No.: US 7,272,033 B2
(45) Date of Patent: Sep. 18, 2007

(54) MAGNETIC FILM STRUCTURE USING SPIN CHARGE, A METHOD OF MANUFACTURING THE SAME, A SEMICONDUCTOR DEVICE HAVING THE SAME, AND A METHOD OF OPERATING THE SEMICONDUCTOR DEVICE

(75) Inventors: Tae-wan Kim, Yongin-si (KR); Wan-jun Park, Seoul (KR); Sang-jin Park, Pyeongtaek-si (KR); In-jun Hwang, Yongin-si (KR); Soon-ju Kwon, Pohang-si (KR); Young-keun Kim, Seoul (KR); Richard J. Gambino, Stony Brook, NY (US)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 5 days.

(21) Appl. No.: 11/193,625

(22) Filed: Aug. 1, 2005

(65) Prior Publication Data
US 2006/0050445 A1 Mar. 9, 2006

(30) Foreign Application Priority Data
Jul. 31, 2004 (KR) ...................... 10-2004-0060719

(51) Int. Cl.
*G11C 11/00* (2006.01)
*G11C 7/00* (2006.01)

(52) U.S. Cl. ...................... 365/158; 365/171; 257/427

(58) Field of Classification Search ................ 365/158, 365/171, 173; 257/427
See application file for complete search history.

(56) References Cited

U.S. PATENT DOCUMENTS

| | | | |
|---|---|---|---|
| 7,126,797 B2* | 10/2006 | Hasegawa et al. | 360/324.1 |
| 2003/0011463 A1* | 1/2003 | Iwasaki et al. | 338/32 R |
| 2003/0151944 A1* | 8/2003 | Saito | 365/173 |
| 2004/0114289 A1* | 6/2004 | Eiselt et al. | 361/62 |

OTHER PUBLICATIONS

Tehrani, Saied, et al., Magnetoresistive Random Access Memory. Using Magnetic Tunnel Junctions, Proceedings of the IEEE, vol. 91. No. 5, pp. 703-714, (May 2003).

* cited by examiner

*Primary Examiner*—Son Dinh
(74) *Attorney, Agent, or Firm*—Lee & Morse, P.C.

(57) ABSTRACT

Provided are a multi-purpose magnetic film structure using a spin charge, a method of manufacturing the same, a semiconductor device having the same, and a method of operating the semiconductor memory device. The multi-purpose magnetic film structure includes a lower magnetic film, a tunneling film formed on the lower magnetic film, and an upper magnetic film formed on the tunneling film, wherein the lower and upper magnetic films are ferromagnetic films forming an electrochemical potential difference therebetween when the lower and upper magnetic films have opposite magnetization directions.

14 Claims, 14 Drawing Sheets

MAGNETIC FILM STRUCTURE USING SPIN CHARGE, A METHOD OF MANUFACTURING THE SAME, A SEMICONDUCTOR DEVICE HAVING THE SAME, AND A METHOD OF OPERATING THE SEMICONDUCTOR DEVICE

BACKGROUND OF THE INVENTION

1. Field of the Invention

The present invention relates to a magnetic film structure using a spin charge, a method of manufacturing the same, a semiconductor memory device having the same, and a method of operating the semiconductor memory device.

2. Description of the Related Art

The degree of integration of semiconductor devices has rapidly increased as semiconductor technologies have been developed. An ideal semiconductor device has a high degree of integration and low power consumption, operates at high speed and is nonvolatile. A conventional semiconductor device may have high power consumption and thereby generate significant heat. As the semiconductor device generates heat, the operation speed thereof rapidly decreases. To solve this drawback, a superconductor may be used, but this is applicable only in a limited field.

Meanwhile, in connection with nonvolatile memory devices, flash memory has been widely used. In addition, as MRAM and SONOS memories have been developed, the nonvolatility of semiconductor memories has been improved.

Unfortunately, the characteristics of the conventional semiconductor device are still far from ideal. Accordingly, a semiconductor device having better characteristics is required. In this regard, an improved semiconductor device using electron spin is provided herein.

SUMMARY OF THE INVENTION

The present invention is therefore directed to a multi-purpose magnetic film structure using spin charge, a method of manufacturing the same, a semiconductor device having the same, and a method of operating the semiconductor device, which substantially overcome one or more of the problems due to the limitations and disadvantages of the related art.

It is therefore a feature of an embodiment of the present invention to provide a multi-purpose magnetic film structure having ferromagnetic films capable of forming an electrochemical potential difference therebetween.

At least one of the above and other features and advantages of the present invention may be realized by providing a multi-purpose magnetic film structure including a lower magnetic film, a tunneling film on the lower magnetic film, and an upper magnetic film on the tunneling film, wherein the lower and upper magnetic films may be ferromagnetic films forming an electrochemical potential difference therebetween when the lower and upper magnetic films have opposite magnetization directions.

The upper magnetic film may include first and second ferromagnetic films on the tunneling film, and a magnetization direction of the first ferromagnetic film may be fixed in a direction by the second ferromagnetic film. The upper magnetic film may be a half-metal ferromagnetic film, which may be completely spin-polarized by a magnetic field. The multi-purpose magnetic film structure may also include a capping layer on the upper magnetic field.

The lower magnetic film may include a first ferromagnetic film contacting the tunneling film and a second ferromagnetic film under the first ferromagnetic film. The lower magnetic film may be a half-metal ferromagnetic film, which may be completely spin-polarized by the magnetic field. The multi-purpose magnetic film structure may also include a seed layer under the lower magnetic film. The multi-purpose magnetic film structure may have a size of less than $100^2$ μm$^2$.

At least one of the above and other features and advantages of the present invention may be realized by providing a method of manufacturing a multi-purpose magnetic film structure, including forming an oxide film on a substrate, forming a lower magnetic film on the oxide film, the lower magnetic film having a spin polarization ratio, forming a tunneling film on the lower magnetic film, forming an upper magnetic film on the tunneling film, wherein the upper magnetic film has a different spin polarization ratio from the lower magnetic film, forming a capping layer on the upper magnetic film, and patterning the capping layer, the upper magnetic film, the tunneling film, and the lower magnetic film.

A seed layer may be further formed on the oxide film before the forming of the lower magnetic film. The forming of the lower magnetic film may include depositing a ferromagnetic film having a higher spin polarization ratio than the upper magnetic film on the oxide film. The forming of the lower magnetic film may also include maintaining the substrate with the oxide film at a temperature of at least about 500° C. while depositing the ferromagnetic film having a higher spin polarization ratio than the upper magnetic film on the oxide film.

The upper magnetic film may be formed by sequentially depositing two ferromagnetic films and may be formed with a half-metal ferromagnetic film having a spin polarization ratio of 80% to 100%. The lower magnetic film may be formed with a half-metal ferromagnetic film having a spin polarization ratio of 80% to 100%. The lower magnetic film may be formed using a ferromagnetic film having a lower spin polarization ratio than the upper magnetic film, and may be formed by depositing two ferromagnetic films.

At least one of the above and other features and advantages of the present invention may be realized by providing a semiconductor memory device including a substrate, a switching element formed on the substrate; and a data storing unit connected to the switching element, the data storing unit including a lower magnetic film, a tunneling film formed on the lower magnetic film; and an upper magnetic film formed on the tunneling film, wherein the lower and upper magnetic films are ferromagnetic films forming an electrochemical potential difference therebetween when the lower and upper magnetic films have opposite magnetization directions.

At least one of the upper and lower magnetic films may be a half-metal ferromagnetic film, and the data storing unit may have a size of less than 100 μm$^2$.

At least one of the above and other features and advantages of the present invention may be realized by providing a method of operating a semiconductor memory device, the semiconductor memory device having a substrate, a switching element formed on the substrate, and a data storing unit connected to the switching element, the data storing unit having a lower magnetic film, a tunneling film and an upper magnetic film that are sequentially deposited, the lower and upper magnetic films being ferromagnetic films forming an electrochemical potential difference therebetween when the lower and upper magnetic films have opposite magnetization directions, wherein, in a state where the switching element is turned off, a magnetic field is applied to the data storing unit in a given direction to record data in the data storing unit.

In a state where the switching element is turned on, an offset voltage of the data storing unit may be measured to read data from the data storing unit. Data recorded in the data storing unit may be read by a first process of applying the magnetic field to the data storing unit such that the upper and lower magnetic films have the same magnetization direction in the state where the switching element is turned on, and a second process of sensing whether or not a current of more than a predetermined value flows through the data storing unit.

In the case where the current of more than the predetermined value is sensed, a magnetization state of one of the upper and lower magnetic films whose magnetization state is varied through the first process may be restored to the original state. A magnetic field having an opposite direction to the magnetic field applied in the first process may be applied to the magnetic film whose magnetization state is varied through the first process to restore the magnetization state of the magnetic film to the original state.

In the state where the switching element is turned off, the upper and lower magnetic films may be allowed to have the same magnetization direction to erase data from the data storing unit.

Since the present invention may reduce a device driving voltage to about several millivolts, power consumption may be reduced and heat generated due to the power consumption may also be reduced. Therefore, a device operation speed may be also increased. Since the magnetic film structure may have a very small size, the degree of integration of a device employing the same may be increased. Furthermore, since the magnetic film structure can have its own potential difference, the magnetic film structure may be used for a battery.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
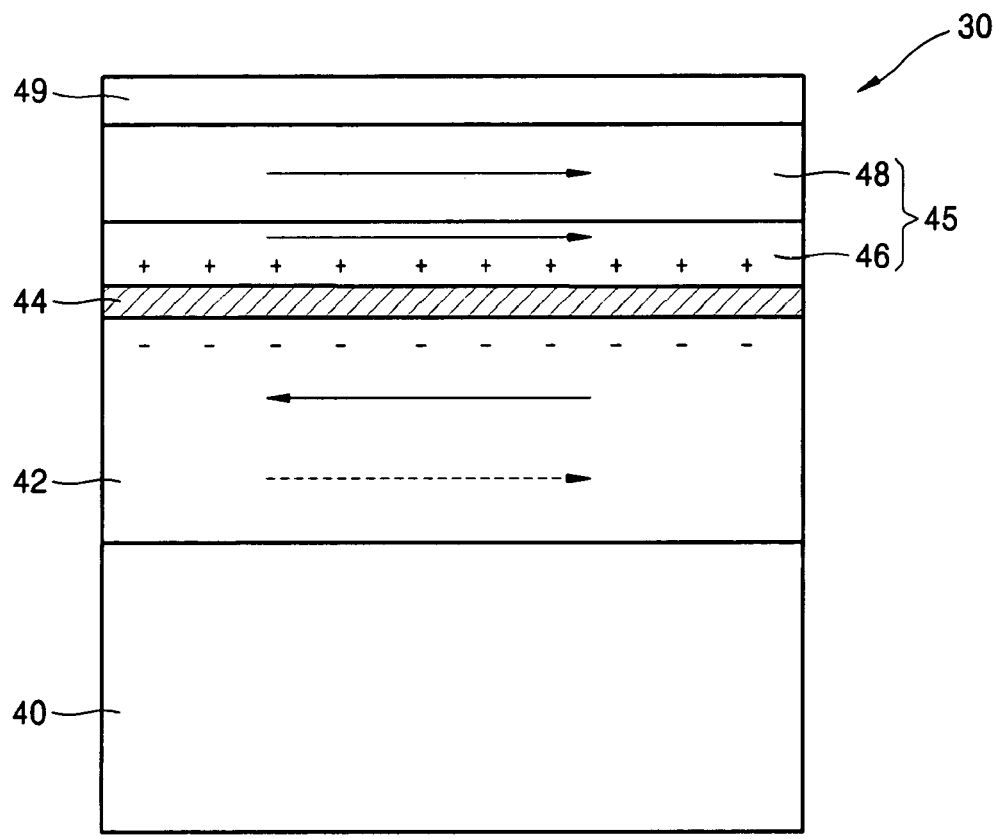
FIG. 1 illustrates a cross-sectional view of a magnetic film structure according to an embodiment of the present invention.

Korean Patent Application No. 10-2004-0060719, filed on Jul. 31, 2004, in the Korean Intellectual Property Office, and entitled: "MAGNETIC FILM STRUCTURE USING SPIN CHARGE, METHOD OF MANUFACTURING THE SAME, SEMICONDUCTOR DEVICE HAVING THE SAME, AND METHOD OF OPERATING THE SEMICONDUCTOR DEVICE," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of a magnetic film structure according to an embodiment of the present invention. A magnetic film structure having a spin charge caused by an electrochemical potential difference of an electron spin state will first be described. The magnetic film structure 30 of FIG. 1 may have vertical and horizontal lengths of about 10 μm, although the vertical and horizontal lengths may be larger or smaller than 10 μm. The magnetic film structure 30 may include a lower magnetic film 42, a tunneling film 44 and an upper magnetic film 45. A seed layer 40 may be provided under the lower magnetic film 42 and a protection capping layer 49 may be provided on the upper magnetic film 45.

The lower magnetic film 42 may be formed under a first condition (20 mTorr, 500° C.) and may have a first electron spin state density. The lower magnetic film 42 may be, e.g., a Heusler alloy or a half-metal ferromagnetic layer, e.g., a $Co_2MnSi$ layer, all electrons of which may be spin-polarized in a predetermined direction when an external magnetic field is applied. The lower magnetic film 42 may also be formed of other ferromagnetic layers that are equivalent to a Heusler alloy or a half-metal ferromagnetic layer. Where the lower magnetic film 42 is a $Co_2MnSi$ layer, it may have a thickness of about 47 nm, but may have a larger or smaller thickness than 47 nm. Where the lower magnetic film 42 is a different half-metal ferromagnetic layer, the lower magnetic film 42 may have a thickness of 47 nm or a different thickness.

A solid-line arrow illustrated in the lower magnetic film 42 denotes a magnetization direction, i.e., a spin polarization direction, of the lower magnetic film 42, caused by an external magnetic field. A dotted-line arrow denotes the magnetization direction of the lower magnetic film 42 when the external magnetic field has an opposite direction.

The tunneling film 44 may have a predetermined thickness through which electrons can tunnel. For example, the tunneling film 44 may be an aluminum oxide layer ($AlO_x$) and may have a thickness of about 2 nm. The tunneling film 44 may be an insulating layer, rather than an oxide layer, and may have a different thickness from an oxide layer.

The upper magnetic film 45 may include first and second ferromagnetic layers 46 and 48, which may be deposited sequentially. The first ferromagnetic film 46 may be a pinned layer having a second electron spin state density, in which the magnetization direction or the spin polarization direction of the electrons is fixed in a given direction. In the first ferromagnetic film 46, the electrons may be spin-polarized in the predetermined direction in the same manner as the lower magnetic film 42. However, all the spin polarizations of the electrons of the first ferromagnetic film 46 do not have the same direction, in contrast to those of the lower magnetic film 42. In other words, most of electrons of the first ferromagnetic film 46 are spin-polarized in the predetermined direction, but some electrons are spin-polarized in a direction opposite to the predetermined direction.

The external magnetization direction of the first ferromagnetic film 46 is a spin polarization direction, with which most of electrons of the first ferromagnetic film 46 are aligned. The arrow illustrated in the first ferromagnetic film 46 denotes the magnetization direction of the first ferromagnetic film 46, i.e., the spin polarization of most of the electrons of the first ferromagnetic film 46. The first ferromagnetic film 46 may be magnetized in the arrow direction shown in the drawings, but a minority of the electrons of the first ferromagnetic film 46 may have an opposite magnetization direction (not shown). The first ferromagnetic film 46 may be a cobalt iron (CoFe) layer.

The second ferromagnetic film 48 may be an antiferromagnetic layer, which may be a pinning layer for pinning the magnetization direction of the first ferromagnetic film 46. The second ferromagnetic film 48 may be, e.g., an iridium manganese (IrMn) layer of a predetermined thickness. The first ferromagnetic film 46 may be pinned by the second ferromagnetic layer 48 through exchange coupling. Accordingly, the first and second ferromagnetic films 46 and 48 may have the same magnetization direction. When the second ferromagnetic film 48 is an IrMn layer, it may have a thickness of about 15.5 nm, although other thicknesses may be suitable, and different thicknesses may be used for different materials.

The capping layer 49 may prevent the second ferromagnetic film 48 from being oxidized and may be formed of, e.g., ruthenium (Ru) having a thickness of about 60 nm. The seed layer 40 may be provided under the lower magnetic film 42 to promote the growth of the lower magnetic film 42 and may include, e.g., a tantalum (Ta) layer having a thickness of about 42 nm and a ruthenium (Ru) layer having a thickness of about 9.5 nm, sequentially deposited.

When the lower magnetic film 42 and the first ferromagnetic film 46 have a different electron spin state density and the tunneling film 44 is interposed between and makes contact with the lower magnetic film 42 and the first ferromagnetic film 46, an electrochemical potential difference is generated between the lower magnetic film 42 and the first ferromagnetic film 46. The electrochemical potential difference causes the electrons of the first ferromagnetic film 46, which are in a spin down state, to pass through the tunneling film 44 and move to the lower magnetic film 42. At this time, the electrons of the first ferromagnetic film 46 are changed in a spin up state. The movement of electrons from the first ferromagnetic film 46 to the lower magnetic film 42 stores a negative (−) charge at an interface of the lower magnetic film 42 and the tunneling film 44 and stores a positive (+) charge at an interface of the first ferromagnetic film 46 and the tunneling film 44. Accordingly, the electrochemical potential difference is generated between the lower magnetic film 42 and the first ferromagnetic film 46.

A predetermined external offset voltage may be applied to the magnetic film structure 30 to eliminate the electrochemical potential difference. Accordingly, a measured current value of the magnetic film structure 30 may be zero at the offset voltage. Since the potential difference between the lower magnetic film 42 and the first ferromagnetic film 46 may be eliminated when the offset voltage is applied, the potential difference may be determined by measuring the offset voltage, since the potential difference is caused by the electrochemical potential difference between the lower magnetic film 42 and the first ferromagnetic film 46.

Also, since the potential difference exists within the magnetic film structure 30, charges may be extracted from the magnetic film structure 30. Accordingly, the magnetic film structure 30 may be used as a power source.

The potential difference existing within the magnetic film structure 30 is caused by opposite magnetization directions of the lower magnetic film 42 and the first ferromagnetic film 46. Also, since the magnetic field may be applied externally to determine the magnetization direction of the lower magnetic film 42, the magnetic film structure 30 may be integrated and used as a rechargeable power source, that is, as a secondary cell. In the example where the magnetic film structure 30 is used as the power source, an integrated unit having a plurality of magnetic film structures 30 serially connected with one another may be used as the power source. Further, the integrated unit may be also connected in parallel and constructed as the power source.

Alternatively, in the example where the magnetic film structure 30 is used as the power source, the magnetization direction of the lower magnetic film 42 may be exchanged by an external magnetic field. Therefore, after the magnetic film structure 30 is charged, that is, after the magnetic field is applied to the lower magnetic film 42 to allow the lower magnetic film 42 to have the opposite magnetization direction to the first ferromagnetic film 46, a magnetic field shielding unit (not shown) may be provided at an external and/or internal of the magnetic film structure 30 such that a magnetization state of the lower magnetic film 42 is not influenced by the external magnetic field. The magnetic field shielding unit may be removed to recharge the magnetic film structure 30.

Figure 2:
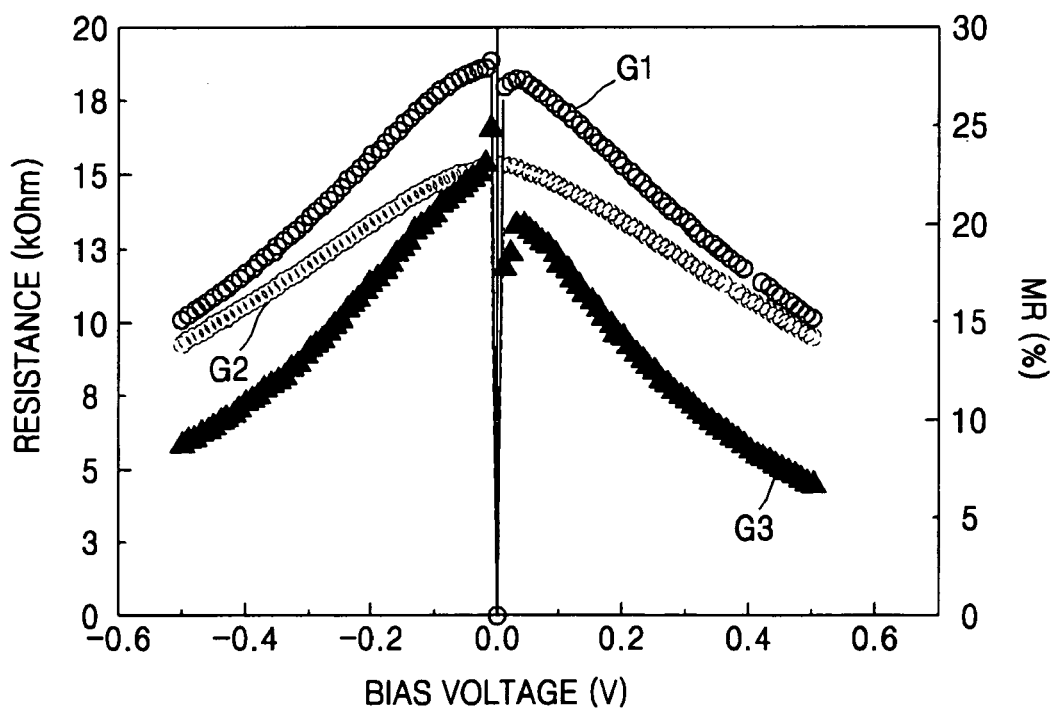
FIG. 2 illustrates a graph of resistance variation of a magnetic film structure when a bias voltage applied to the magnetic film structure of FIG. 1 varies from −0.6V to +0.6V.

A physical characteristic of the magnetic film structure 30 illustrated in FIG. 1 will next be described with reference to the attached drawings. FIG. 2 illustrates graphs of resistance variation of a magnetic film structure where a bias voltage, applied to the magnetic film structure of FIG. 1, varies from −0.6V to +0.6V. In FIG. 2, a graph G1 represents a resistance variation of the magnetic film structure of FIG. 1 when the lower magnetic film 42 has an opposite magnetization direction to the first ferromagnetic film 46. A graph G2 represents a resistance variation of the magnetic film structure of FIG. 1 when the lower magnetic film 42 has the same magnetization direction as the first ferromagnetic film 46. A graph G3 represents the variation of the magneto-resistance ratio of the magnetic film structure of FIG. 1. As may be seen from graphs G1, G2 and G3, the resistances and the magneto-resistance ratio of the magnetic film structure of FIG. 1 vary greatly when the bias voltage is about zero.

Figure 3:
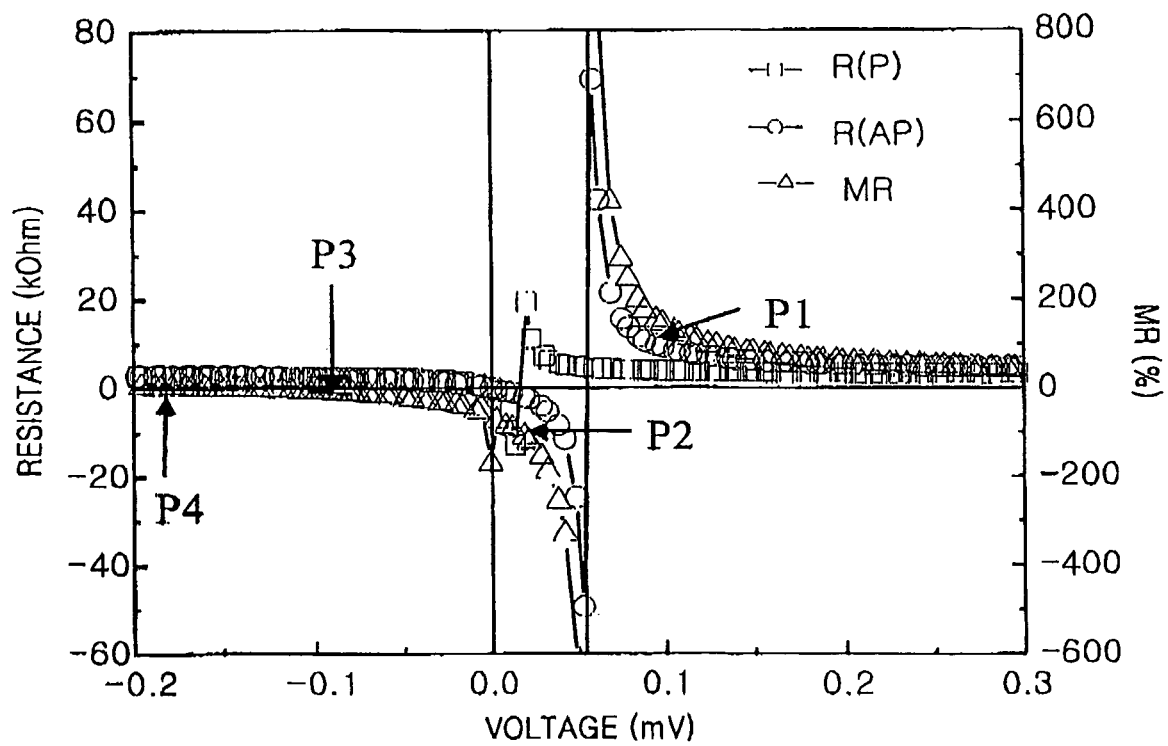
FIG. 3 illustrates a graph of resistance variation of the magnetic film structure of FIG. 1 at a bias voltage (−0.2 mV to +0.3 mV), at which a resistance and a magneto-resistance ratio are asymmetric.

FIG. 3 illustrates in greater detail the resistances and the magneto-resistance ratio of the magnetic film structure of FIG. 1 when the bias voltage is about zero. FIG. 3 illustrates a graph of resistance variation of the magnetic film structure of FIG. 1 at a bias voltage changing from +0.3 mV to −0.2 mV, at which a resistance and a magneto-resistance ratio are asymmetric. In FIG. 3, reference symbol "□", R(P), represents a variation of a resistance (hereinafter, referred to as "first resistance") when the lower magnetic film 42 of the magnetic film structure of FIG. 1 has the same magnetization direction as the first ferromagnetic film 46. Reference symbol "○", R(AP), represents a variation of a resistance (hereinafter, referred to as "second resistance") when the lower magnetic film 42 has the opposite magnetization direction to the first ferromagnetic film 46. Reference symbol "Δ", MR, represents a variation of the magneto-resistance ratio.

Referring to FIG. 3, the first and second resistances and the magneto-resistance ratio exhibit variation at the bias voltage between 0 mV and 0.1 mV (100 μV). In detail, as the bias voltage reaches 0.1 mV, the first and second resistances R(P), R(AP), and the magneto-resistance ratio MR of the inventive magnetic film structure slowly increase. Then, as the bias voltage passes 0.1 mV, the second resistance R(AP) and the magneto-resistance ratio MR begin to rapidly increase. However, the first resistance R(P) of the magnetic film structure 30 does not vary greatly. As the bias voltage approaches 0.050 mV (50 μV), the second resistance R(AP) and the magneto-resistance ratio MR rapidly increase, going off the scale of FIG. 3. However, the first resistance R(P) does not vary greatly. As the bias voltage approaches 0 mV, the first resistance R(P) varies rapidly. However, the variation of the first resistance R(P) is much less than the variation of the second resistance R(AP).

As the bias voltage applied to the magnetic film structure 30 of FIG. 1 almost reaches 0.050 mV, the second resistance R(AP) suddenly becomes less than zero, and reaches a large negative value. Even in the example where the second resistance R(AP) exhibits significant variation, the first resistance R(P) does not greatly and also does not exhibit the same variation. As the bias voltage continues to approach 0 mV, the second resistance R(AP) rapidly increases to zero. At the bias voltage at which the second resistance R(AP) reaches from a large negative value to zero, the first resistance R(P) exhibits some variation. However, as mentioned above, the variation of the first resistance R(P) is not large when compared to the variation of the second resistance R(AP). Accordingly, when the variation of the second resistance R(AP) is compared with the variation of the first resistance R(P), the variation of the first resistance R(P) is negligible.

When the first resistance R(P) varies, it becomes negative for a short time, and then, when the bias voltage is 0 mV, the first resistance R(P) again becomes zero. After that, when the bias voltage becomes negative, the first resistance R(P) becomes again positive. When the bias voltage is 0 mV, even the second resistance R(AP) becomes zero (0), and then when the bias voltage is negative, the second resistance R(AP) has a positive value, a little larger than zero. This state is maintained even as the bias voltage decreases more. The variation of the magneto-resistance ratio MR of the magnetic film structure 30 generally follows the variation of the second resistance R(AP).

The magnetic film structure 30 exhibits the variation of the second resistance R(AP) when the second resistance R(AP) rapidly increases at the bias voltage between 0 mV and 0.1 mV, but does not exhibit a variation of the first resistance R(P) comparable to the variation of the second resistance R(AP). Accordingly, the magneto-resistance ratio MR of the magnetic film structure 30 is at least 200% at the bias voltage between 0 mV and 0.1 mV, as shown in FIG. 3. Specifically, the magneto-resistance ratio MR has a large value moving away from a measurement range at the bias voltage at which the second resistance R(AP) has the variation change.

The potential difference between the lower magnetic film 42 and the first ferromagnetic film 46 causes the magnetic film structure 30 to have a large magneto-resistance ratio MR. Since the magnetic film structure 30 can have a significant magneto-resistance ratio MR below 0.3 mV, a semiconductor device including the magnetic film structure 30 may exhibit reduced power consumption.

Figure 4:
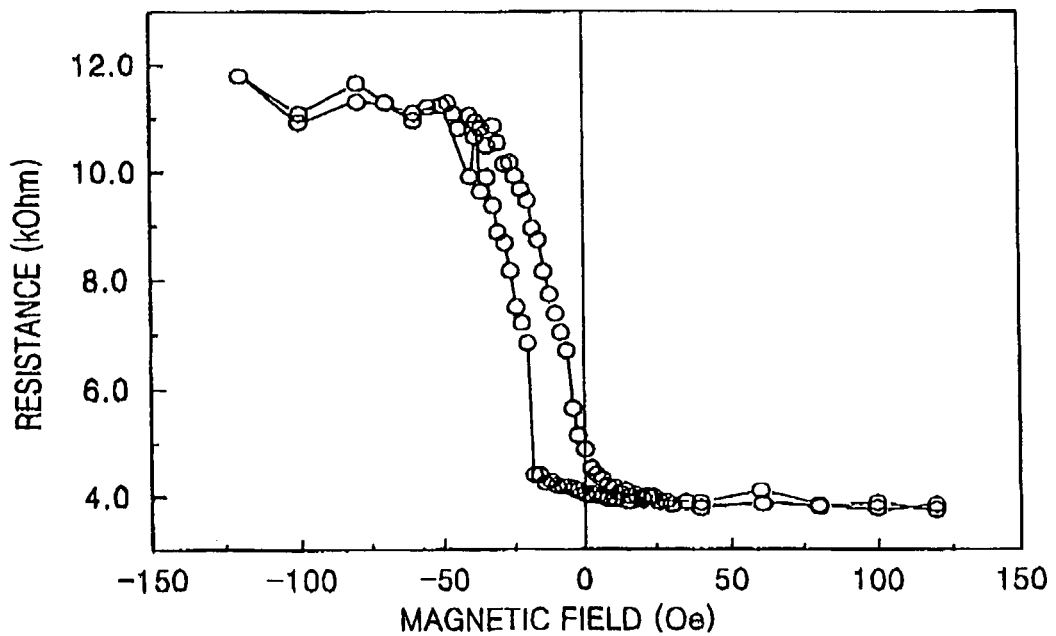
FIG. 4 illustrates a graph of resistance variation depending on a magnetic field of the magnetic film structure of FIG. 1 at a point P1 of FIG. 3.

FIG. 4 illustrates a graph of resistance variation versus magnetic field of the magnetic film structure of FIG. 1 at a point P1 of FIG. 3. At the point P1 the bias voltage is about 0.088 mV (88 μV) and the magneto-resistance ratio is about 197%.

Figure 5:
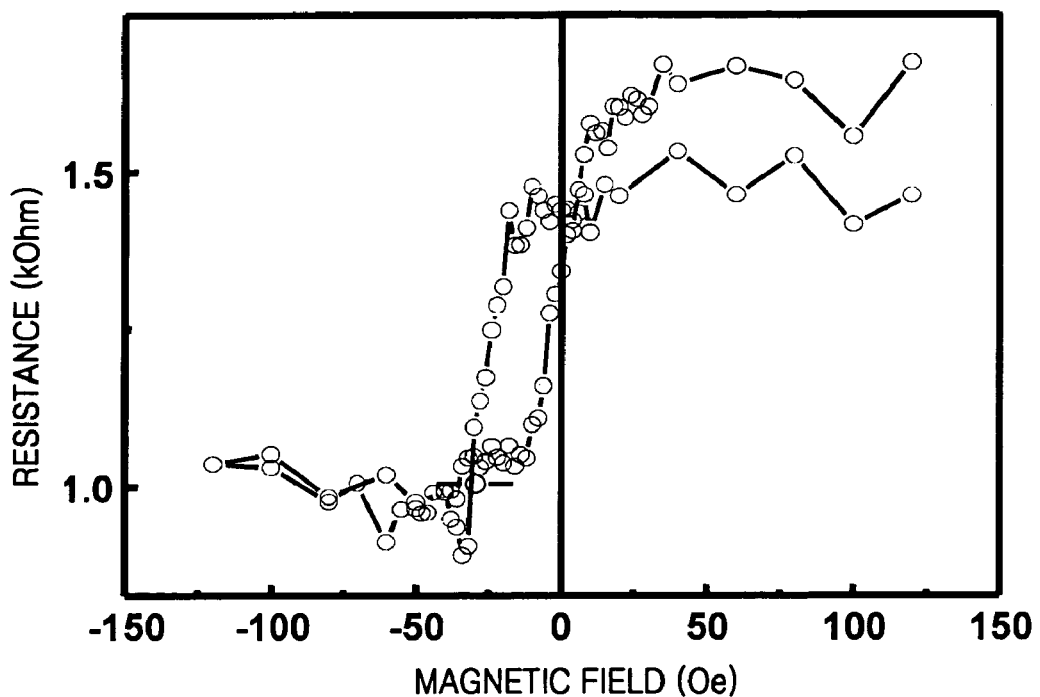
FIG. 5 illustrates a graph of resistance variation depending on a magnetic field of the magnetic film structure of FIG. 1 at a point P2 of FIG. 3.

FIG. 5 illustrates a graph of resistance variation versus magnetic field of the magnetic film structure of FIG. 1 at a point P2 of FIG. 3. At the point P2 the bias voltage is about 0.016 mV (16 μV) and the magneto-resistance ratio is about −41%.

Figure 6:
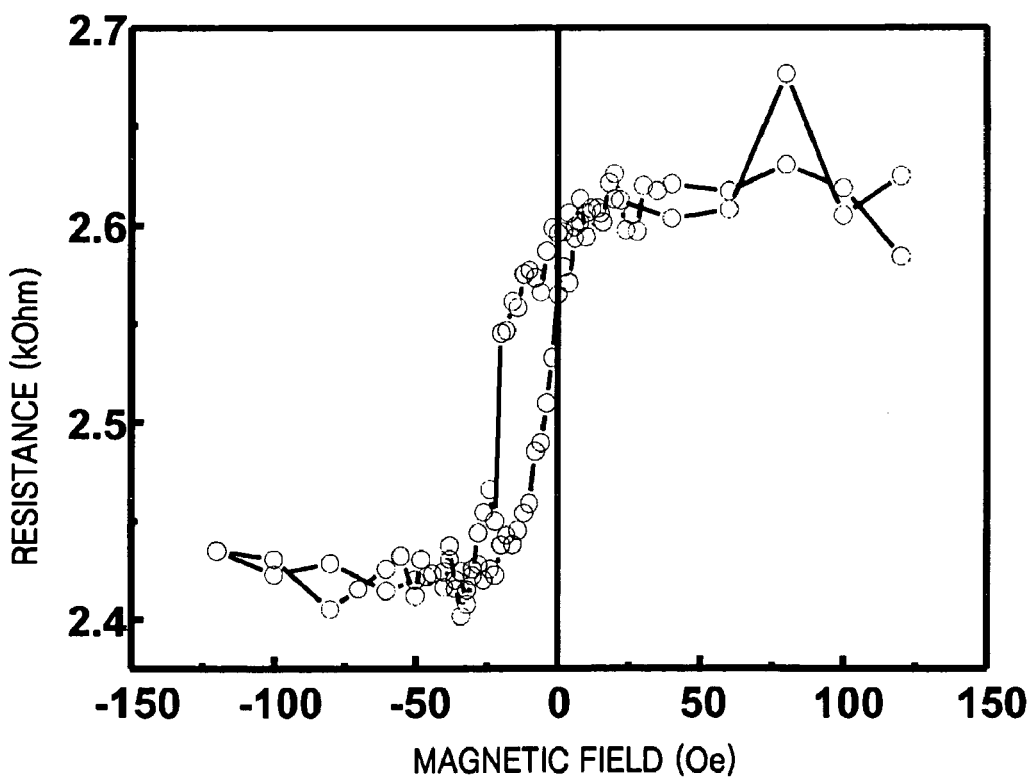
FIG. 6 illustrates a graph of resistance variation depending on a magnetic field of the magnetic film structure of FIG. 1 at a point P3 of FIG. 3.

FIG. 6 illustrates a graph of resistance variation versus magnetic field of the magnetic film structure of FIG. 1 at a point P3 of FIG. 3. At the point P3 the bias voltage is about −0.089 mV (−89 μV) and the magneto-resistance ratio is about −10%.

Figure 7:
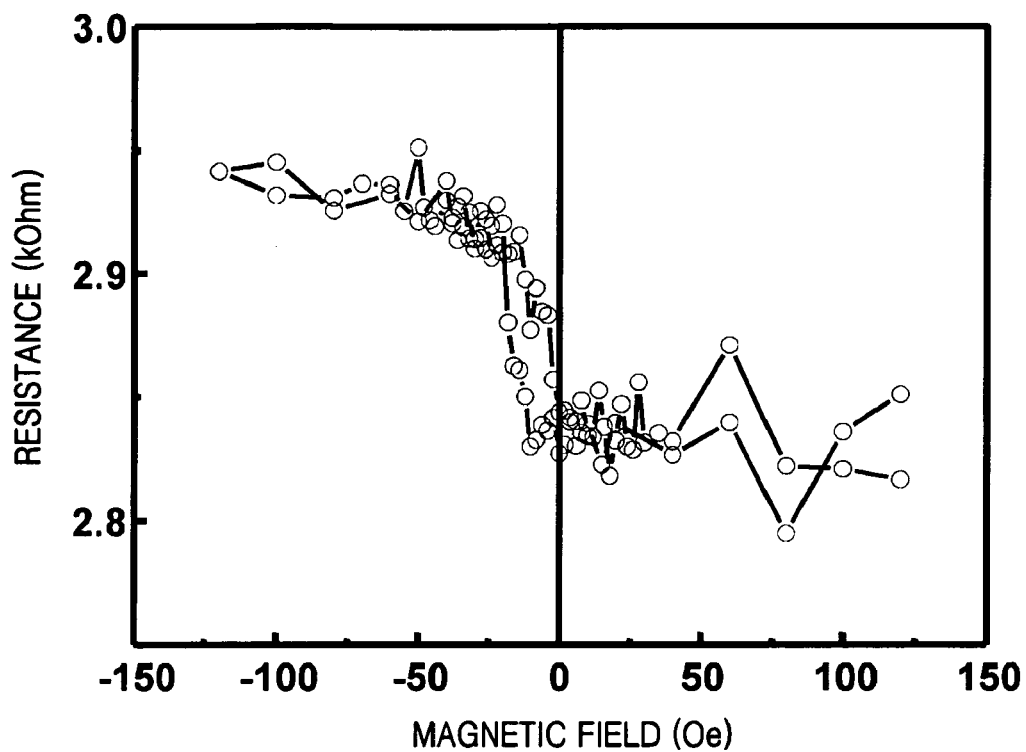
FIG. 7 illustrates a graph of resistance variation depending on a magnetic field of the magnetic film structure of FIG. 1 at a point P4 of FIG. 3.

FIG. 7 illustrates a graph of resistance variation depending on a magnetic filed of the magnetic film structure of FIG. 1 at a point P4 of FIG. 3. At the point P4 the bias voltage is about −0.171 mV (−171 μV) and the magneto-resistance ratio is about −2%.

In Table 1, below, the magneto-resistance ratio of the magnetic film structured 30 is summarized for several bias voltages, with reference to FIG. 3.

TABLE 1

| Bias voltage (μV) | Magneto-resistance ratio (%) |
|---|---|
| 64 | 760 |
| 70 | 380 |
| 76 | 240 |
| 88 | 170 |
| 98 | 130 |
| 106 | 110 |
| 117 | 94 |
| 126 | 85 |
| 137 | 78 |

Figure 8:
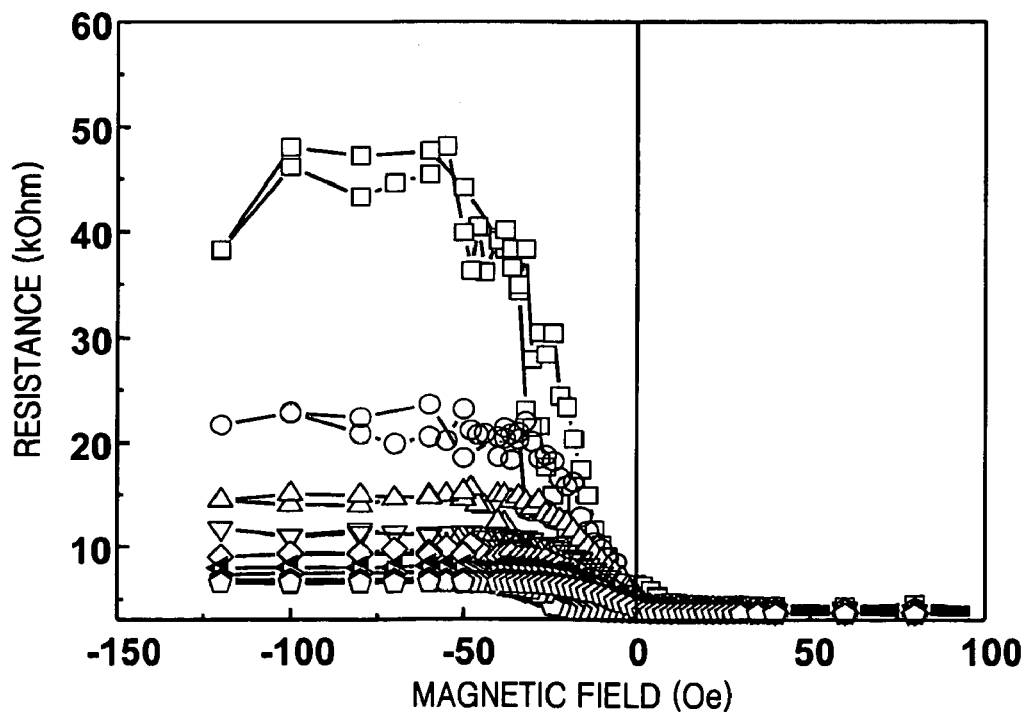
FIG. 8 illustrates a graph of resistance variation of the magnetic film structure of FIG. 1 depending on a magnetic field when a plurality of bias voltages is respectively applied.

FIG. 8 illustrates a graph of resistance variation of the magnetic film structure of FIG. 1 versus magnetic field for a plurality of bias voltages. In FIG. 8, a reference symbol "□" denotes the resistance variation of the magnetic film structure 30 versus the external magnetic field when a bias voltage of 64 μV is applied to the magnetic film structure 30. A reference symbol "○" denotes a resistance variation when a bias voltage of 70 μV is applied. A reference symbol "Δ" denotes a resistance variation when a bias voltage of 76 μV is applied. A reference symbol "∇" denotes a resistance variation when a bias voltage of 88 μV is applied. A reference symbol "◊" denotes a resistance variation when a bias voltage of 98 μV is applied. A reference symbol "◄" denotes a resistance variation when a bias voltage of 106 μV is applied. A reference symbol "▷" denotes a resistance variation when a bias voltage of 117 μV is applied. A black hexagon denotes a resistance variation when a bias voltage of 126 μV is applied. A pentagon denotes a resistance variation when a bias voltage of 137 μV is applied.

Figure 9:
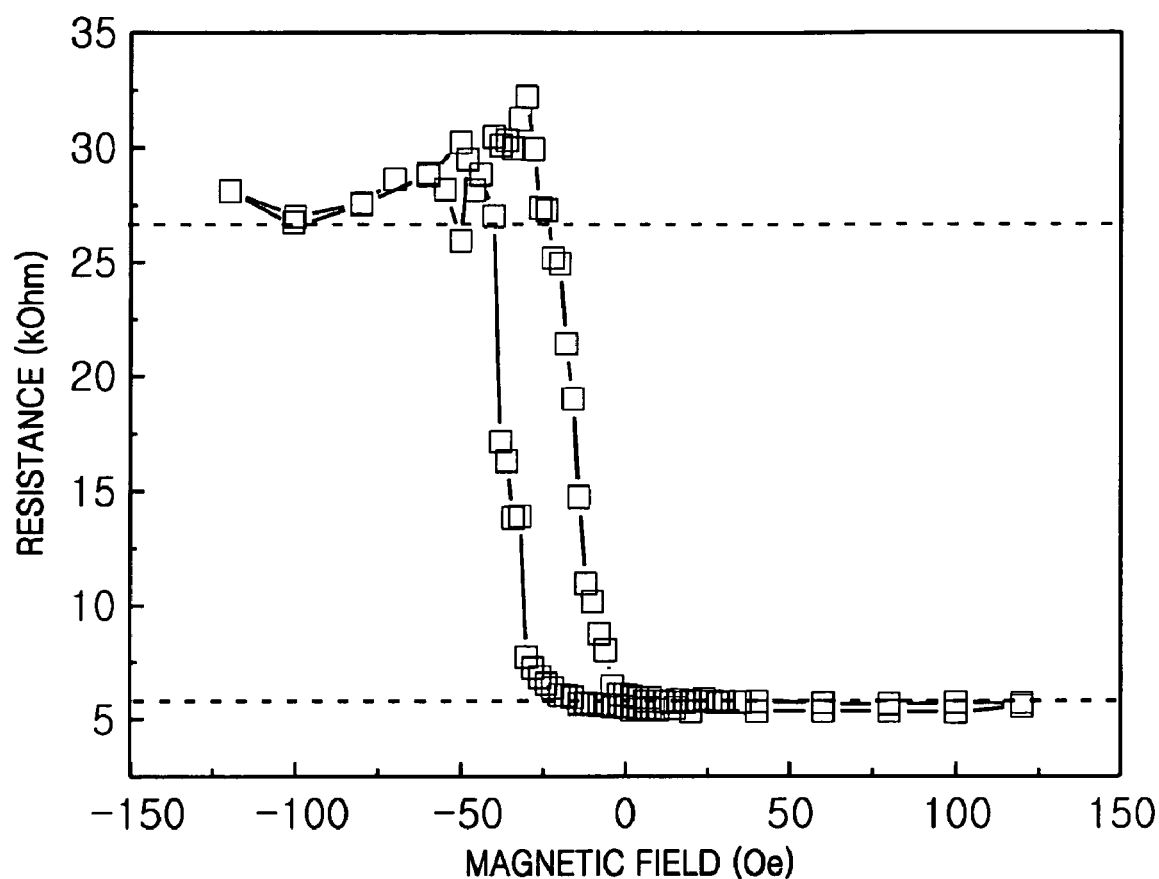
FIG. 9 illustrates a graph of resistance variation of the magnetic film structure of FIG. 1 depending on a magnetic field at a bias voltage of 55 mV.

FIG. 9 illustrates a graph of resistance variation of the magnetic film structure of FIG. 1 versus magnetic field at a bias voltage of 55 mV. Referring to FIG. 9, when the magnetic field is more than zero, the magnetic film structure 30 has the lowest resistance. When the magnetic field is less than zero, the resistance of the magnetic film structure 30 rapidly increases to be as large as at least six times the lowest resistance.

Figure 10:
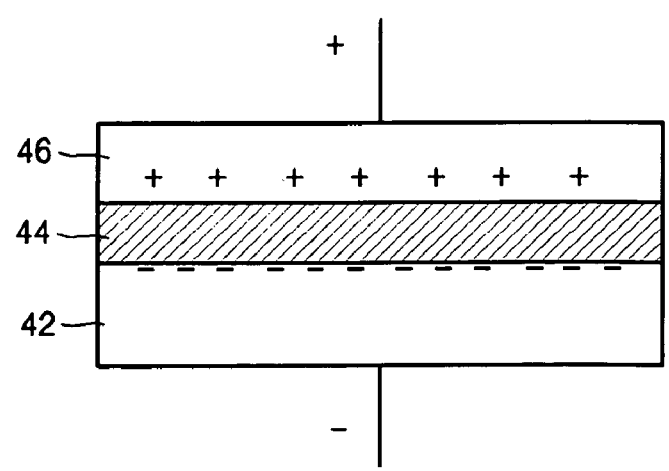
FIGS. 10 and 11 illustrate cross-sectional views of stages in a method of applying a bias voltage to the magnetic film structure of FIG. 1.
Figure 11:
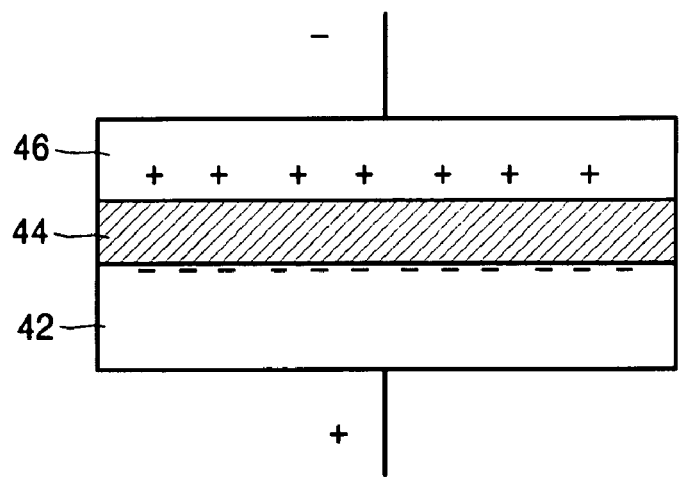

Two methods may be employed for applying a bias voltage to the magnetic film structure 30. In a first method, the bias voltage may be applied to the magnetic film structure 30 such that a current flows from the first ferromagnetic film 46 to the lower magnetic film 42 (actually, electrons flow from the lower magnetic film 42 to the first ferromagnetic film 46), as illustrated in FIG. 10. A second method may be performed oppositely to the first method, as illustrated in FIG. 11.

Figure 12:
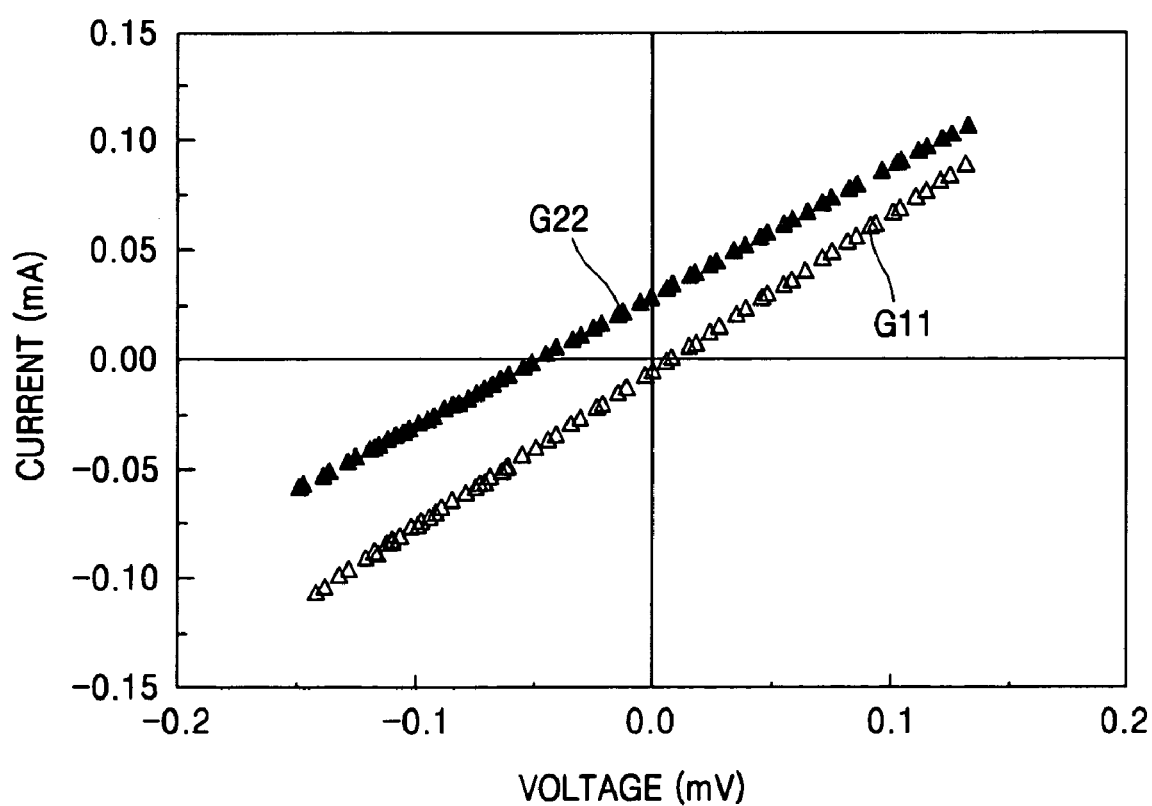
FIG. 12 illustrates a graph of current-voltage characteristic of the magnetic film structure of FIG. 1 to which a bias voltage is applied, as illustrated in FIG. 10.
Figure 13:
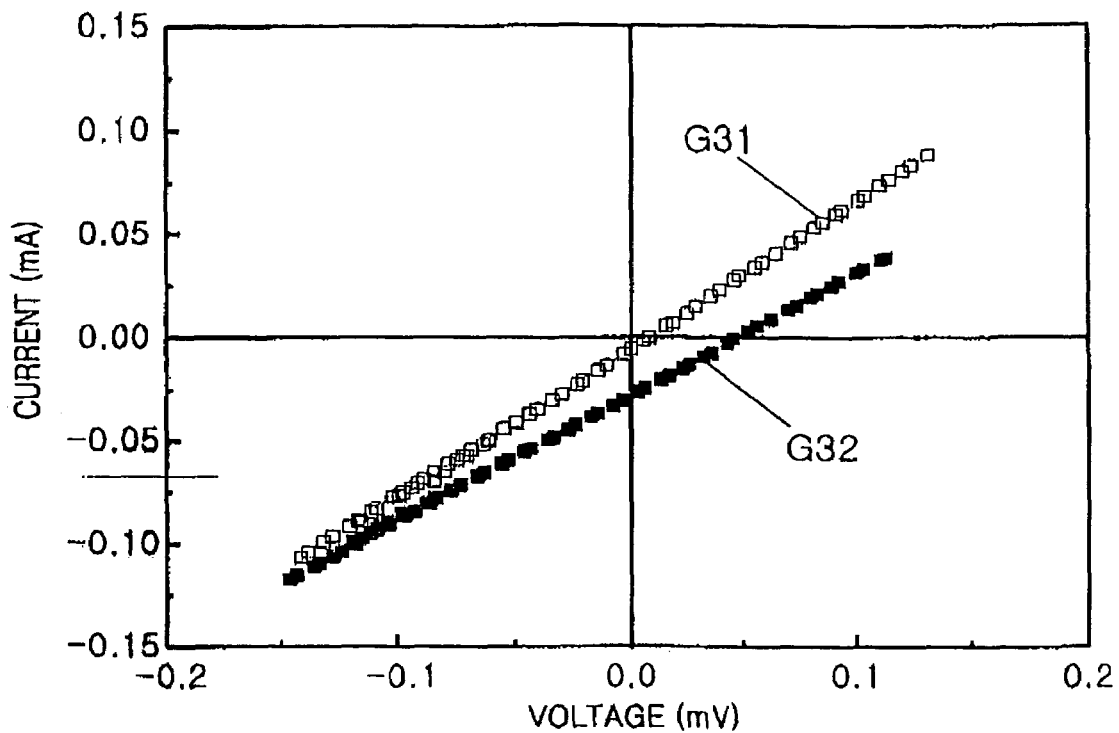
FIG. 13 illustrates a graph of a current-voltage characteristic of the magnetic film structure of FIG. 1 to which a bias voltage is applied, as illustrated in FIG. 11.
Figure 14:
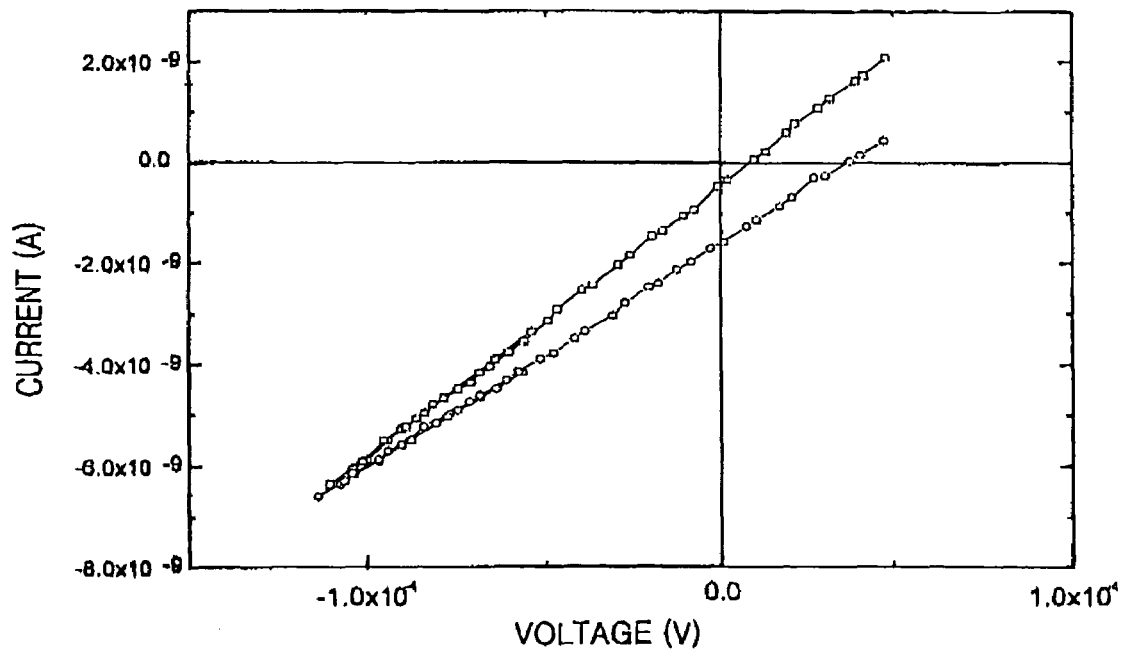
FIG. 14 illustrates a curve of a current-voltage characteristic of the magnetic film structure of FIG. 1 having a lower magnetic film (half-metal ferromagnetic layer) that is formed under a second condition (20 mTorr, 600° C.) and having a size of 10 μm×10 μm.
Figure 15:
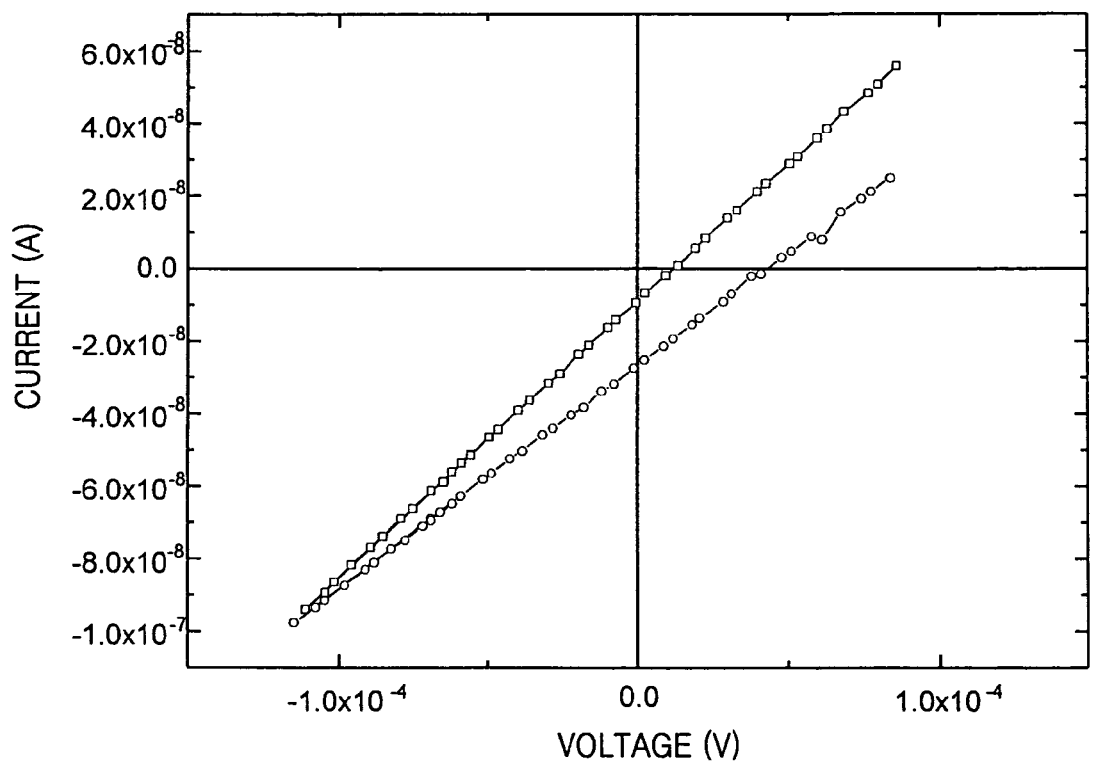
FIG. 15 illustrates a curve of a current-voltage characteristic of the magnetic film structure of FIG. 1 having a lower magnetic film (half-metal ferromagnetic layer) that is formed under a second condition (20 mTorr, 600° C.) and having a size of 30 μm×30 μm.

FIGS. 12 and 13 illustrate current-voltage characteristics of the magnetic film structure 30. FIG. 12 illustrates a graph of current-voltage characteristic of the magnetic film structure of FIG. 1 to which a bias voltage is applied according to the first method, as illustrated in FIG. 10. FIG. 13 illustrates a graph of a current-voltage characteristic of the magnetic film structure of FIG. 1 to which a bias voltage is applied according to the second method, as illustrated in FIG. 11

In FIG. 12, a graph G11 illustrates the current-voltage characteristic measured when the lower magnetic film 42 and the first ferromagnetic film 46 of the magnetic film structure 30 have the same magnetization direction. Additionally, a graph G22 illustrates the current-voltage characteristic measured when the lower magnetic film 42 and the first ferromagnetic film 46 have opposite magnetization directions to each other.

Referring to the graphs G11 and G22, in a case where the lower magnetization film 42 and the first ferromagnetic film 46 have the same magnetization direction (hereinafter, referred to as "the first case"), when the bias voltage is zero, the current is also zero. However, in a case where the lower magnetization film 42 and the first ferromagnetic film 46 have the opposite magnetization directions to each other (hereinafter, referred to as "the second case"), when the bias voltage is zero, the current is not zero. In the second case, when the bias voltage is −0.050 mV, the current becomes zero. In other words, the bias voltage at which the current is zero in the second case is shifted to the left by about −0.050 mV.

A material characteristic of the magnetic film structure 30 may vary depending on the materials constituting the magnetic film structure 30, the size of the magnetic film structure 30 and/or the temperature of the magnetic film structure 30. Therefore, the degree of shift of the bias voltage in the second case may depend on the material constituting the lower magnetic film 42 and/or the first ferromagnetic film 46, and may depend on the size and/or temperature of the films 42 and 46. This is illustrated in FIG. 13, a case in which the bias voltage at which the current becomes zero is shifted to the right.

A graph G31 of FIG. 13 illustrates a current-voltage characteristic in the first case, and is the same as the graph G11 of FIG. 12. A graph G32 of FIG. 13 illustrates a current-voltage characteristic in the second case. Referring to the second graph G32, when the magnetic film structure 30 is in the second case and the bias voltage is applied to the magnetic film structure 30, as shown in FIG. 10, the current becomes zero at the bias voltage of 0.050 mV(50 μV), not 0 mV. In other words, the bias voltage at which the current becomes zero may be shifted to the right. As a result, when the magnetic film structure 30 is in the second case, the bias voltage at which the current becomes zero may be shifted. This may be achieved using any method, although the bias voltage may have a different shift direction.

The shift of the bias voltage at which the current becomes zero when the magnetic film structure 30 is in the second case occurs because of the potential difference caused by the electrochemical potential between the lower magnetic film 42 and the first ferromagnetic film 46. In other words, even though the bias voltage of 0 mV is applied, e.g., in the example where the potential difference exists between the lower magnetic film 42 and the first ferromagnetic film 46, the current of the magnetic film structure 30 does not become zero. Thus, a current derived from the potential difference may be measured from the magnetic film structure 30.

However, as the bias voltage (hereinafter, referred to as "the shift voltage") having a magnitude corresponding to the potential difference is applied to the magnetic film structure 30, charges may be eliminated from the interface of the lower magnetic film 42 and the first ferromagnetic film 46, such that the potential difference no longer exists between the lower magnetic film 42 and the first ferromagnetic film 46. In other words, where the shift voltage and the potential difference offset each other, the current measured from the magnetic film structure 30 will go to zero. The potential difference between the lower magnetic film 42 and the first ferromagnetic film 46 may be eliminated at the shift voltage, so that the current of the magnetic film structure 30 becomes zero. Therefore, the shift voltage becomes the offset voltage.

The offset voltage of the magnetic film structure 30 may be defined as a difference of the bias voltage at which the current becomes zero is in the first case and the bias voltage at which the current becomes zero in the second case. That is, the offset voltage may equal the shift voltage. However, the bias voltage at which the current becomes zero is very close to 0 mV when the magnetic film structure 30 is in the first case, as illustrated in FIGS. 12 and 13. Accordingly, the shift voltage may be regarded as the offset voltage.

The potential difference existing between the lower magnetic film 42 and the first ferromagnetic film 46 may be caused by the electrochemical potential difference between the lower magnetic film 42 and the first ferromagnetic film 46. Accordingly, the measurement of the offset voltage may essentially be a measurement of the electrochemical potential difference between the lower magnetic film 42 and the first ferromagnetic film 46.

Since the current is zero at the offset voltage, the resistance is infinite, according to the equation R=V/I. Accordingly, when the magnetic film structure 30 is in the second case, the bias voltage is close to the offset voltage while the resistance and the magneto-resistance ratio vary (FIG. 3).

The offset voltage of the magnetic film structure 30 varies with a size of the magnetic film structure 30. In detail, as the size of the magnetic film structure 30 is increased, the offset voltage is decreased. If the size is more than a predetermined value, the voltage shift is not shown in the graph of the current-voltage characteristic. This means that when the voltage shift is not generated, the offset voltage is zero. The properties are illustrated in FIGS. 14-17.

Figure 16:
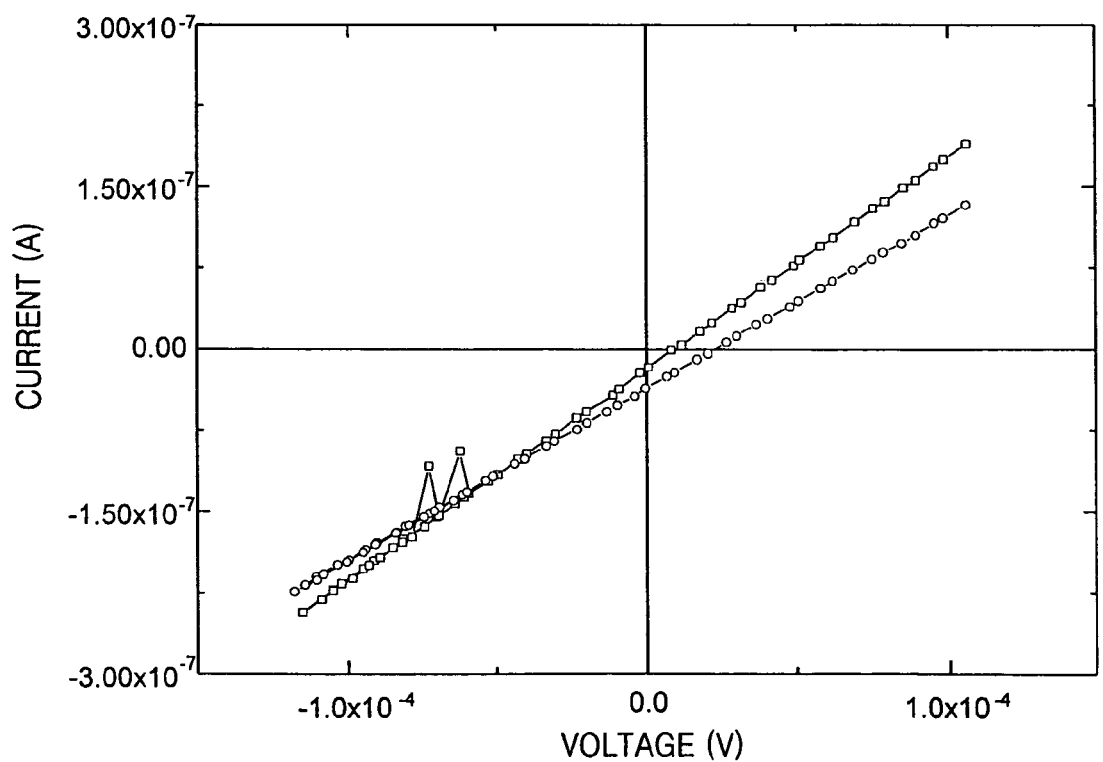
FIG. 16 illustrates a curve of a current-voltage characteristic of the magnetic film structure of FIG. 1 having a lower magnetic film (half-metal ferromagnetic layer) that is formed under a second condition (20 mTorr, 600° C.) and having a size of 50 μm×50 μm.
Figure 17:
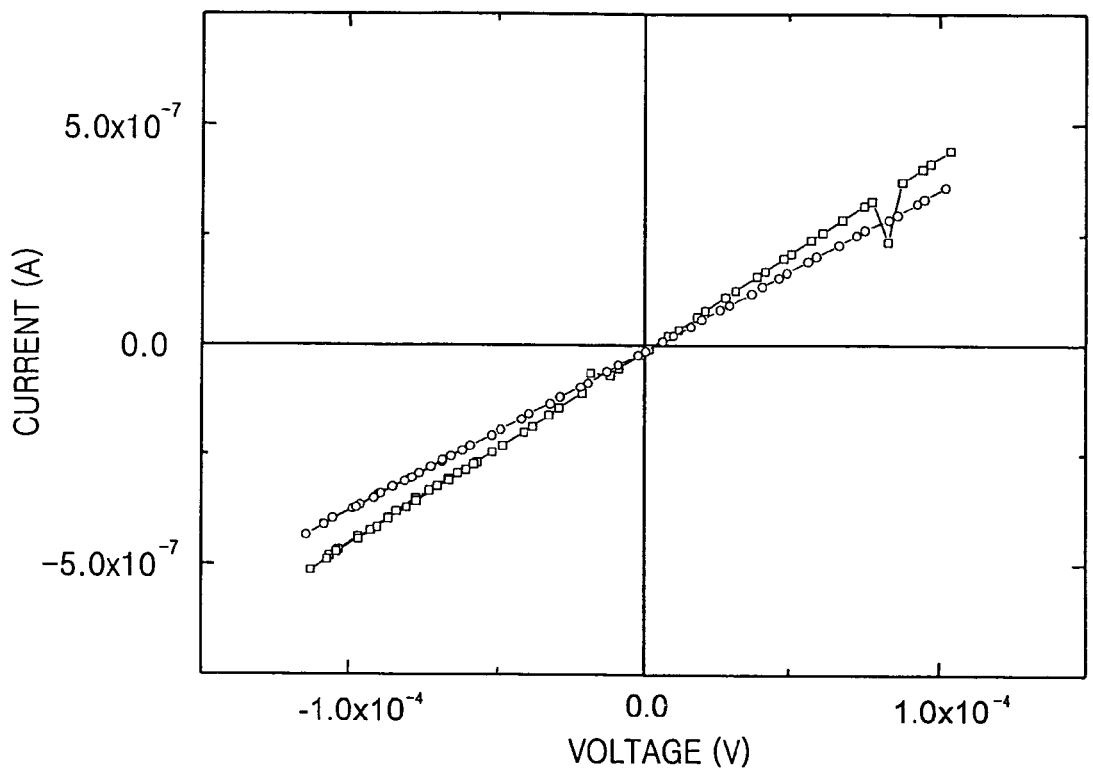
FIG. 17 illustrates a curve of a current-voltage characteristic of the magnetic film structure of FIG. 1 having a lower magnetic film (half-metal ferromagnetic layer) that is formed under a second condition (20 mTorr, 600° C.) and having a size of 100 μm×100 μm.

FIGS. 14-17 illustrate results respectively measured when the lower magnetic film 42 of the magnetic film structure 30 is formed under the second condition (20 mTorr, 600° C.) and the magnetic film structure 30 has the sizes of 10 μm×10 μm (FIG. 14), 30 μm×30 μm (FIG. 15), 50 μm×50 μm (FIG. 16) and 100 μm×100 μm (FIG. 17).

In FIGS. 14-17, a reference symbol "□" denotes a current-voltage characteristic measured in the first case and a reference symbol "○" denotes a current-voltage characteristic measured in the second case. Referring to FIGS. 14 to 17, when the magnetic film structure 30 has the sizes of 10 μm×10 μm and 30 μm×30 μm, the offset voltage is approximately 27 μV. However, when size is 50 μm×50 μm, the offset voltage is smaller, about 14 μV, as illustrated in FIG. 16. Additionally, when the size is 100 μm×100 μm, the offset voltage becomes 0 μV, as illustrated in FIG. 17.

Figure 18:
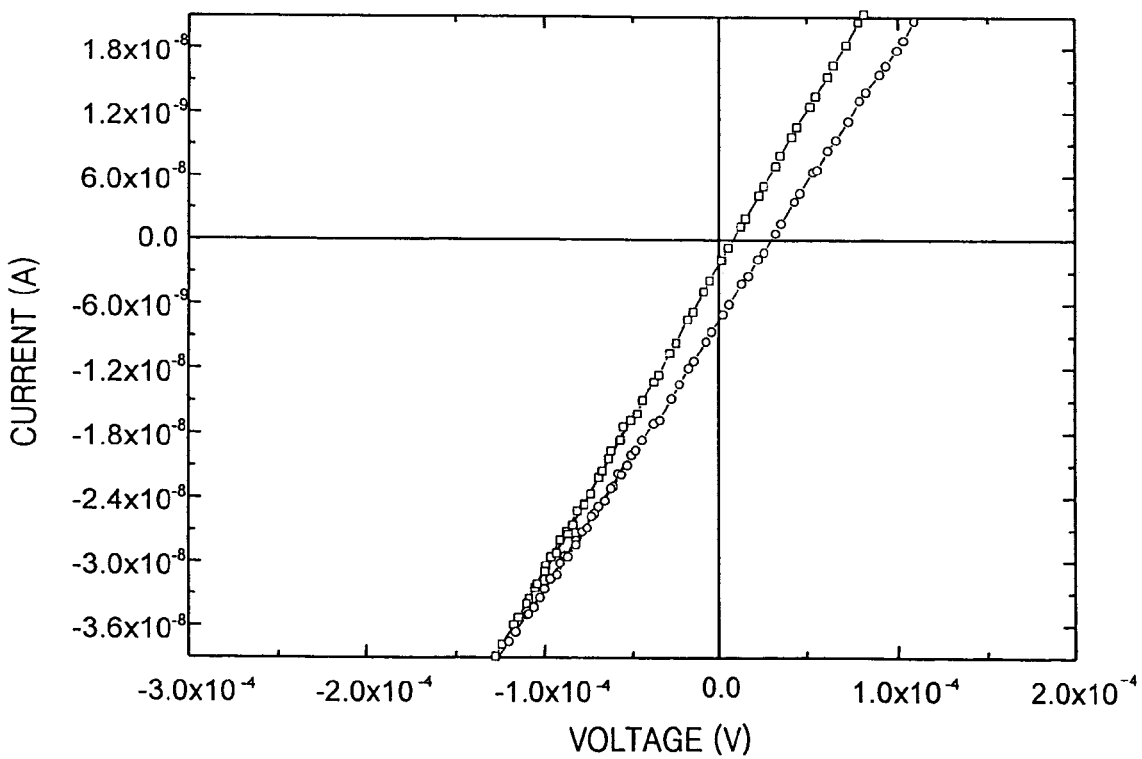
FIG. 18 illustrates a curve of a current-voltage characteristic of the magnetic film structure of FIG. 1 to which a resistor is connected.

A resistor may be connected to the magnetic film structure 30. A current-voltage characteristic of this scenario is illustrated in FIG. 18. Referring to FIG. 18, even where the resistor is connected, an offset voltage may be generated, although it may be smaller than when the resistor is not connected.

A temperature dependency of the offset voltage will now be described. Equation 1 is theoretically obtained from the offset voltage and the temperature of the magnetic film structure 30 shown in FIG. 1.

$$Vd = (8.4 \times 10^{-5}) \eta^2 (Ie/A) C^{1/2} (1/T^{1/4})$$ Equation 1:

In Equation 1, Ie is electron current, η is spin deflection current, A is cross section, C is current degree and T is absolute temperature. The offset voltage Vd is proportional to $T^{-1/4}$.

Figure 19:
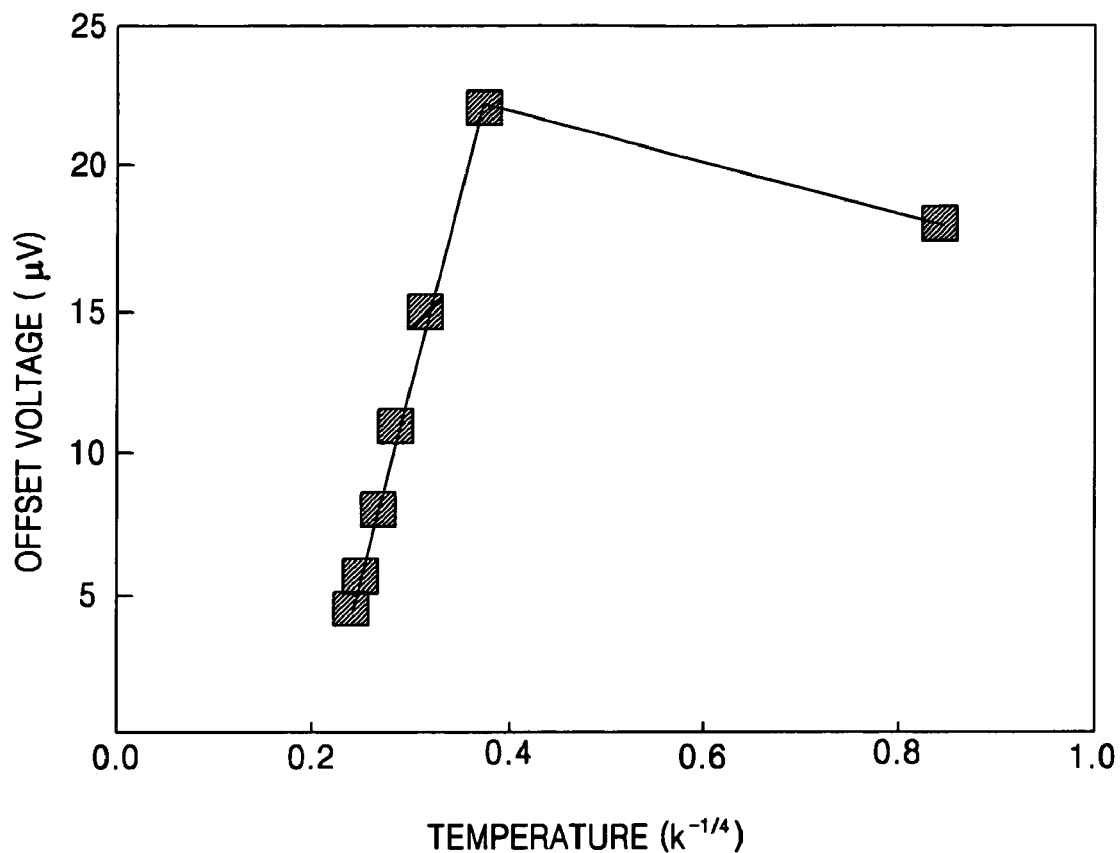
FIG. 19 illustrates a graph of variation of an offset voltage depending on the variation of an absolute temperature in a magnetic film structure of FIG. 1.

In order to verify whether or not the temperature dependency of the magnetic film structure 30 actually satisfies Equation 1, the offset voltage for the magnetic film structure 30 may be measured, e.g., at temperatures ranging from 50K to 300K, at which phonon scattering is dominant. This measurement result is illustrated in FIG. 19. Referring to FIG. 19, when the temperature T ranges from 50K to 300K, the offset voltage is proportional to $T^{-1/4}$. However, this is not so at T=5K, where a residual resistance effect is dominant. Thus, a theoretical result and an experimental result for the temperature dependency of the offset voltage are consistent with each other when the temperature T of the magnetic film structure 30 is a range of at least 50K to 300K.

Figure 20:
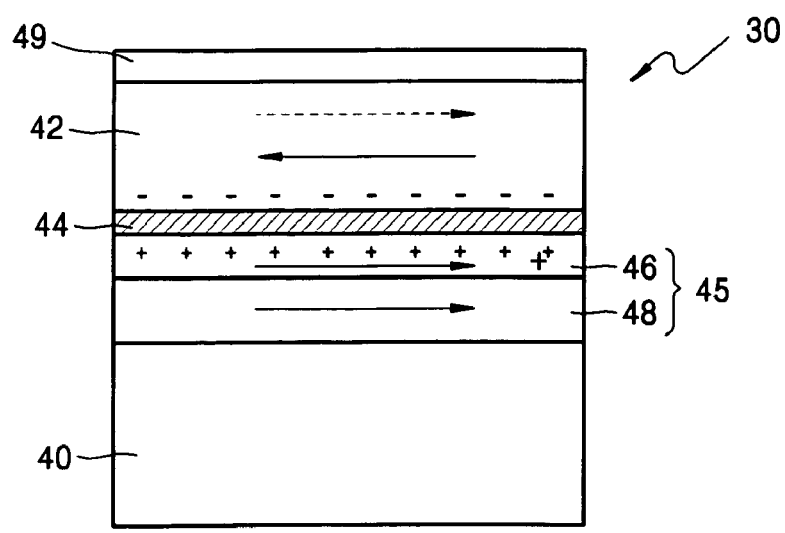
FIG. 20 illustrates a cross-sectional view of the magnetic film structure of FIG. 1 with a lower magnetic film and an upper magnetic film being reversed.

In a magnetic film structure 30 having the above-described physical characteristic, positions of the half-metal ferromagnetic film 42 and the upper magnetic film 45 may be reversed. For example, as shown in FIG. 20, the half-metal ferromagnetic film 42 may be provided on the tunneling film 44 and the upper magnetic film 45 may be provided under the tunneling film 44. The first ferromagnetic film 46 of the upper magnetic film 45 may be in contact with the tunneling film 44 and the second ferromagnetic film 48 may be positioned under the first ferromagnetic film 46.

Figure 21:
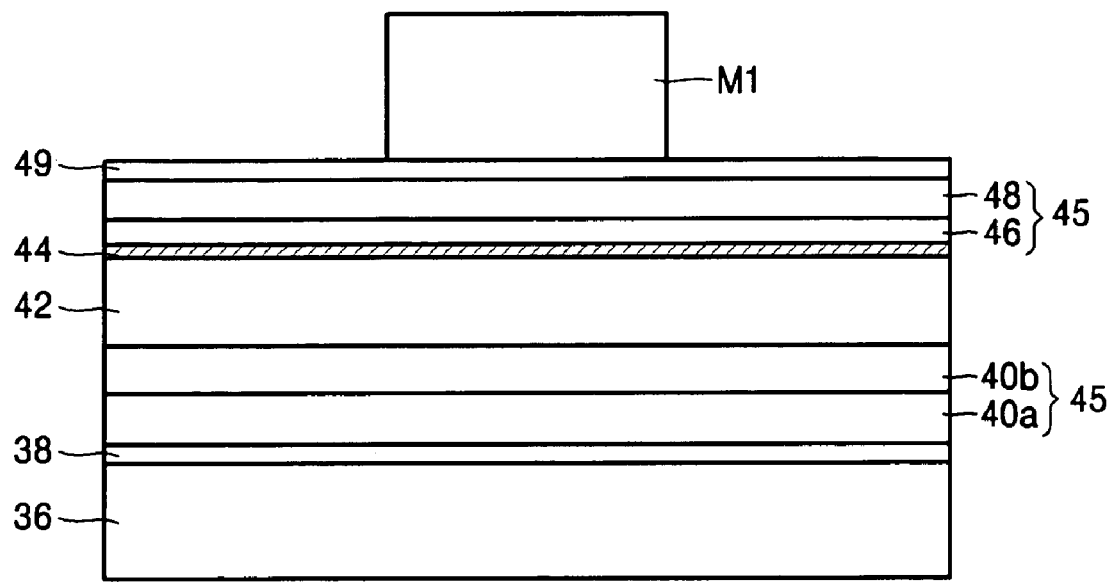
FIGS. 21 and 22 illustrate stages in a method of manufacturing the magnetic film structure of FIG. 1.

A manufacturing method of the magnetic film structure 30 of FIG. 1 will now be described. Referring to FIG. 21, a thin insulating film 38 may be formed on a substrate 36, e.g., a silicon substrate. The insulating film 38 may be formed of oxide or nonoxide. Where the substrate 36 is a silicon substrate, the insulating film 38 may be formed of silicon oxide, but it may also be formed of other oxides. The silicon oxide film may be grown using a thermal growth method. A seed layer 40 may be formed on the insulating film 38. The seed layer 40 may help promote the growth of a lower magnetic film 42, and may help smooth a surface of the lower magnetic film 42 to help form a tunneling film 44 to a regular thickness. The lower magnetic film 42 may be formed on the insulating film 38.

The lower magnetic film 42 may be formed of a predetermined compound ferromagnetic material, e.g., a half-metal ferromagnetic (HMF) material. In this description, the lower magnetic film 42 will be described as the half-metal ferromagnetic film 42.

Where the magnetic film structure 30 is to be used as a magnetic tunnel junction layer of a magnetic random access memory (MRAM), the half-metal ferromagnetic film 42 may be used as a free layer, in which a magnetization direction, i.e., a spin polarization, is changed by an external magnetic field.

The seed layer 40 may be formed using, e.g., a sputtering method or other deposition methods. The seed layer 40 may be formed by sequentially depositing first and second seed layers 40a and 40b. The seed layer 40 may be formed as a magnetic layer, a nonmagnetic layer, or a combination of the magnetic layer and the nonmagnetic layer. Where the seed layer 40 is formed as a nonmagnetic layer, the first and second seed layers 40a and 40b may be respectively formed of, e.g., tantalum (Ta) and ruthenium (Ru). In this example, the first seed layer 40a may be formed to thickness of, e.g., about 42 nm, and the second seed layer 40b may be formed to a thickness of, e.g., about 9.5 nm. Where the first and second seed layers 40a and 40b are formed using other material layers, they may have different thicknesses from the above-described thicknesses.

After the seed layer 40 is formed, the half-metal ferromagnetic film 42 may be deposited on the seed layer 40. The half-metal ferromagnetic film 42 may be the lower magnetic film. The half-metal ferromagnetic film 42 may be formed of a ferromagnetic material having a spin polarization ratio of 80% to 100%. Also, the half-metal ferromagnetic film 42 may be formed of a ferromagnetic material having a higher spin polarization ratio than the upper magnetic film 45. The half-metal ferromagnetic film 42 may be formed of, e.g., $Co_2MnSi$. $Co_2MnSi$ is a Heusler alloy and is found to be a half-metal ferromagnetic film in a calculation of a band structure. Where the half-metal ferromagnetic film 42 is a $Co_2MnSi$ film, the half-metal ferromagnetic film 42 may be formed to have a predetermined thickness of, e.g., about 47 nm. Where the half-metal ferromagnetic film 42 is formed of other materials, the half-metal ferromagnetic film 42 may have different thicknesses.

In order to form the half-metal ferromagnetic film 42 with improved crystallinity, the substrate 36 may be maintained at a predetermined temperature, e.g., above about 500° C., or between 500° C. to 600° C. The half-metal ferromagnetic film 42 may be formed at a low pressure, for example, at $5\times10^{-8}$ Torr. The half-metal ferromagnetic film 42 may be formed using, e.g., deposition, sputtering, etc., while maintaining the above-described temperature and pressure conditions. Where the seed layer 40 and the half-metal ferromagnetic film 42 are all formed using sputtering, the seed layer 40 and the half-metal ferromagnetic film 42 may be formed in situ using the same sputtering equipment.

The roughness of half-metal ferromagnetic film 42 may be reduced by, e.g., suitably controlling related variables such as a radio frequency (RF) power or a pressure. Accordingly, the tunneling film 44 may be formed to a regular thickness on the half-metal ferromagnetic film 42.

After the half-metal ferromagnetic film 42 is formed, the tunneling film 44 may be formed on the half-metal ferromagnetic film 42. The tunneling film 44 may be formed of oxide, e.g., aluminum oxide-alumina ($Al_2O_3$), and may be also formed of nonoxide. Where the tunneling film 44 is aluminum oxide, the tunneling film 44 may be, e.g., about 1.5 nm thick. Where the tunneling film 44 is formed of oxides other than aluminum oxide, or nonoxide, the tunneling film 44 may be formed at a different thickness. Further, where the tunneling film 44 is formed of aluminum oxide, the tunneling film 44 may be formed using, e.g., sputtering, in the same manner as the seed layer 40 and the half-metal ferromagnetic film 42.

In detail, after the half-metal ferromagnetic film 42 is formed using sputtering equipment, the sputtering equipment may be cooled to a room temperature. Aluminum film may then be deposited at a predetermined thickness on the half-metal ferromagnetic film 42 in the cooled sputtering equipment. The deposited aluminum film may then be oxidized using a plasma oxidation process to form the aluminum oxide film on the half-metal ferromagnetic film 42. The plasma oxidation process may be performed in the sputtering equipment, or in other equipment. Where the plasma oxidation process is performed using the sputtering equipment, the sputtering equipment may be maintained with an atmosphere of pure oxygen and a pressure of 150 mTorr until the plasma oxidation process is completed.

After the tunneling film 44 is formed, the upper magnetic film 45 may be formed on the tunneling film 44. The upper magnetic film 45 may be formed using, e.g., sputtering or other deposition processes. The upper magnetic film 45 may be formed by sequentially depositing first and second ferromagnetic films 46 and 48. The first ferromagnetic film 46 may have a magnetization direction corresponding to a direction of the second ferromagnetic film 48. The first ferromagnetic film 46 may be formed of, e.g., CoFe or of other ferromagnetic materials, and may have a different thickness depending on the material. For example, where the first ferromagnetic film 46 is formed of cobalt iron, the first ferromagnetic film 46 may be about 7.5 nm thick, although the first ferromagnetic film 46 may be formed of other materials and may be formed thicker or thinner.

The second ferromagnetic film 48 may be a pinning film for establishing the magnetization direction of the first ferromagnetic film 46. The second ferromagnetic film 48 may be formed as, e.g., a single film or a multi-layer film. Where the second ferromagnetic film 48 is a single film, it may be formed to a predetermined thickness using, e.g., an anti ferromagnetic film (AFM) such as an iridium manganese (IrMn) film about 15.5 nm thick. Where the second ferromagnetic film 48 is a multi-layer film, the second ferromagnetic film 48 may be formed using, e.g., a synthetic anti-ferromagnetic (SAF) film having a conductive film and a magnetic film provided on and under the conductive film. The magnetization direction of the first ferromagnetic film 46 may be established by an exchange bias effect or an interlayer coupling through the SAF film.

After the upper magnetic film 45 is formed, a capping layer 49 may be formed on the upper magnetic film 45 to prevent the oxidation of the upper magnetic film 45, especially, the oxidation of the second ferromagnetic film 48. The capping layer 49 may be formed using, e.g., the sputtering process described above, which may be at room temperature, or using other deposition processes. Where the capping layer 49 is formed using sputtering, the capping layer 49 may be formed in situ after the upper magnetic film 45 is formed. The capping layer 49 may be, e.g., ruthenium (Ru) having a thickness of 60 nm, although the capping layer 49 may be formed of different materials and to different thicknesses.

Next, a photosensitive film pattern M1 may be formed on the capping layer 49 to define a predetermined region of the capping layer 49. The defined region of the capping layer 49 may have a size of, e.g., 10 μm×10 μm and may be extended to allow for the observation of the offset voltage. For example, the defined region may be extended to have a size of 30 µm×30 µm, 50 µm×50 µm, etc. Further, the defined region need not have a square shape and may have different length sides.

Figure 22:
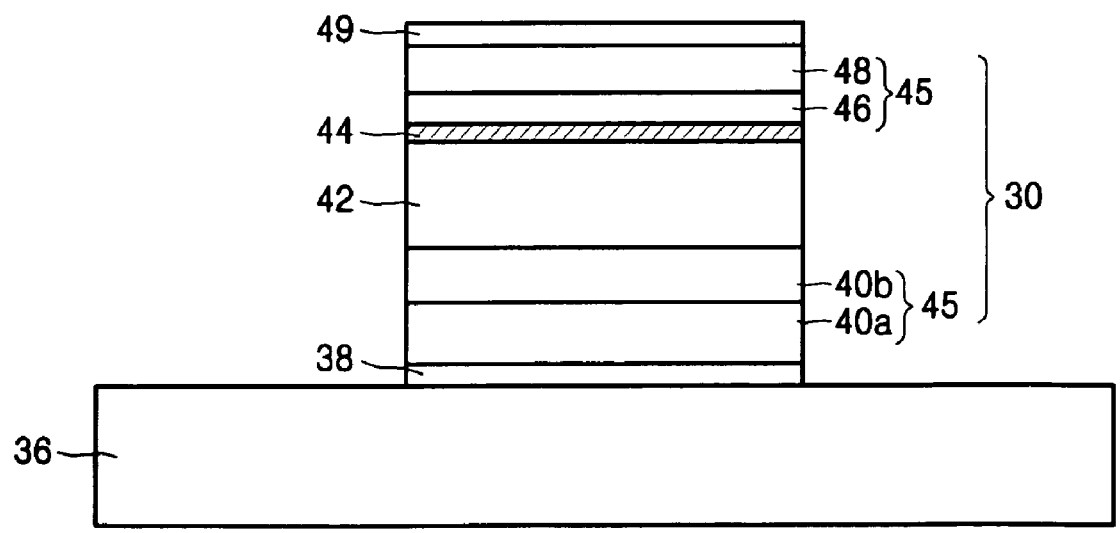

The photosensitive film pattern Ml may be used as an etching mask to etch the capping layer 49 at a periphery of the photosensitive film pattern M1. The etching may be performed until the substrate 36 is exposed. The photosensitive film pattern M1 may then be eliminated. Thus, the magnetic film structure 30 of FIG. 1 may be formed on the substrate 36 as shown in FIG. 22. Further, in the above-mentioned manufacturing method, the positions of the half-metal ferromagnetic film 42 and the upper magnetic film 45 may be changed with respect to each other.

Figure 23:
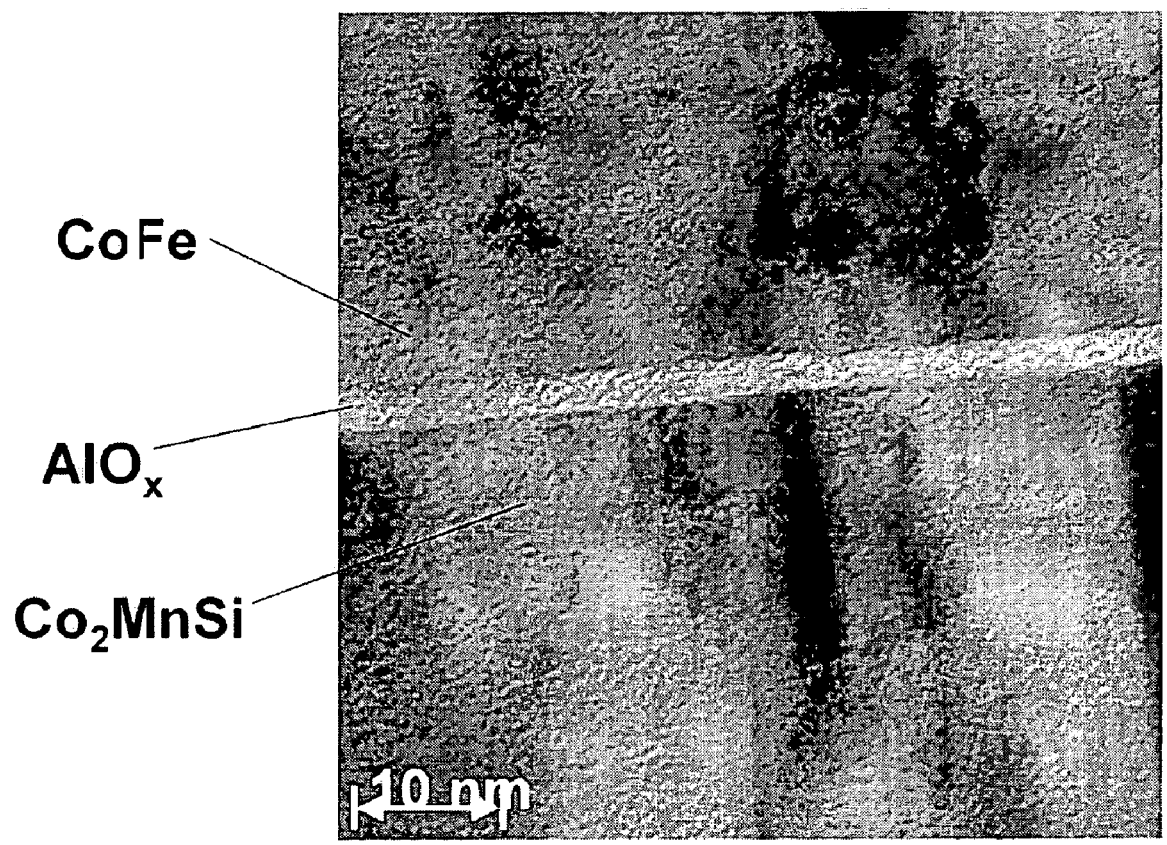
FIG. 23 illustrates a transmission electron microscopy (TEM) image of a uniform thickness of a tunneling film of the magnetic film structure of FIG. 1 formed through the manufacturing method shown in FIGS. 21 and 22.

FIG. 23 illustrates a transmission electron microscopy (TEM) image of a uniform thickness tunneling film of the magnetic film structure of FIG. 1 formed through the manufacturing method illustrated in FIGS. 21 and 22. Referring to FIG. 23, the tunneling film 44 may exhibit a regular thickness.

Figure 24:
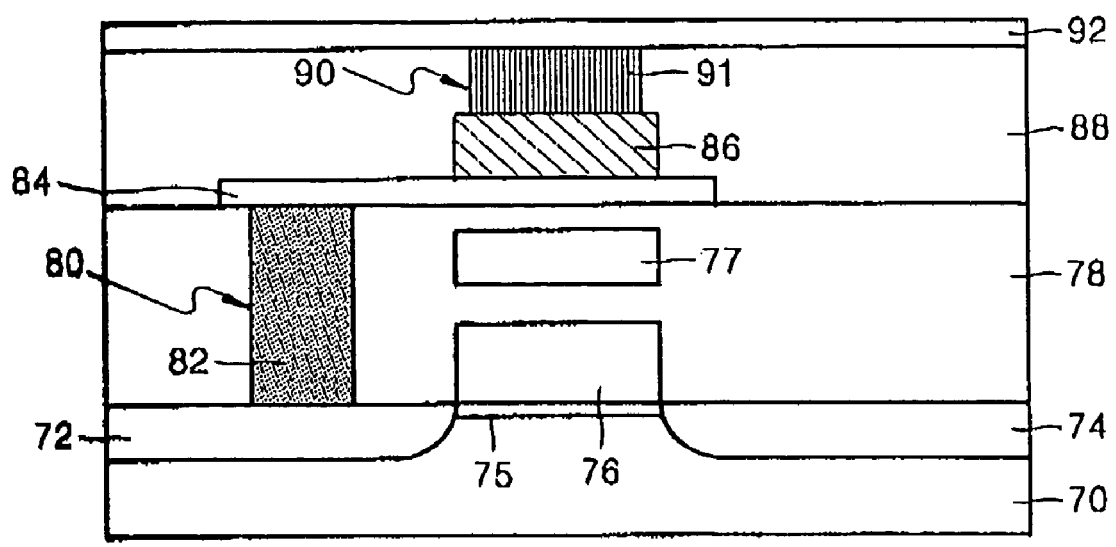
FIG. 24 illustrates a cross-sectional view of a magnetic RAM according to the present invention in which the magnetic film structure of FIG. 20 is used as a magnetic tunnel junction (MTJ) layer.

A semiconductor device having the magnetic film structure 30 of FIG. 1, e.g., a semiconductor memory device, will now be described. FIG. 24 illustrates a cross-sectional view of a magnetic RAM according to the present invention, in which the magnetic film structure of FIG. 20 is used as a magnetic tunnel junction (MTJ) layer. Referring to FIG. 24, the MRAM may have first and second impurity regions 72, 74, formed by doping conductive impurities into a semiconductor substrate 70. A channel region 75 may be formed in the semiconductor substrate 70 between the first and second impurity regions 72 and 74. The first impurity region 72 may be a source region or a drain region. The second impurity region 74 may also be a source region or a drain region. A deposited gate material 76 may be formed on the channel region 75 between the first and second impurity regions 72 and 74. The deposited gate material 76 may include a gate insulating film (not shown), a gate electrode (not shown) and a gate spacer (not shown). The semiconductor substrate 70, the first and second impurity regions 72 and 74, the channel region 75 and the deposited gate material 76 may constitute a field effect transistor (FET).

An interlayer insulating layer 78 may be formed on the semiconductor substrate 70 to cover the first and second impurity regions 72 and 74 and the deposited gate material 76. A contact hole 80 may be provided in the interlayer insulating layer 78 to expose the first impurity region 72. The contact hole 80 may be filled with a conductive plug 82. The conductive plug 82 and the first impurity region 72 may be in ohmic contact with each other to reduce a contact resistance. A pad conductive layer 84 may be formed on the interlayer insulating layer 78 to be connected to the conductive plug 82. The pad conductive layer 84 may be extended over the deposited gate material 76. A digit line 77 may be formed in the interlayer insulating layer 78 between the pad conductive layer 84 and the deposited gate material 76. The digit line 77 may be used to generate the magnetic field for recording data in the MTJ layer 86 (described later). The MTJ layer 86 may be provided on the pad conductive layer 84. The MTJ layer 86 may be provided over the digit line 77.

The MTJ layer 86 may be the magnetic film structure 30 of FIG. 1. An interlayer insulating layer 88 may be formed on the interlayer insulating layer 78 to cover the MTJ layer 86. A via hole 90 may be provided in the interlayer insulating layer 88 to expose the MTJ layer 86. The via hole 90 may be filled with a conductive plug 91. A bit line 92 may be formed on the interlayer insulating layer 88 to be connected to the conductive plug 91. The bit line 92 may be used together with the digit line 77 to record data in the MTJ layer 86. In other words, a direction of a current flowing through the bit line 92 and the digit line 77 may be controlled to control the magnetization direction of the half-metal ferromagnetic film (e.g., feature 42 of FIG. 1) of the MTJ layer 86.

The above-described MRAM may be formed using a general MRAM manufacturing process. However, the MTJ layer 86 may also be formed using a manufacture method of the magnetic film structure 30.

An operation method of the MRAM illustrated in FIG. 24 will now be described. At this time, the MTJ layer 86, which may be used as the data storing unit, of the MRAM is assumed to include the half-metal ferromagnetic film 42 provided on the tunneling film 44, as illustrated in FIG. 20.

<Writing>

Figure 25:
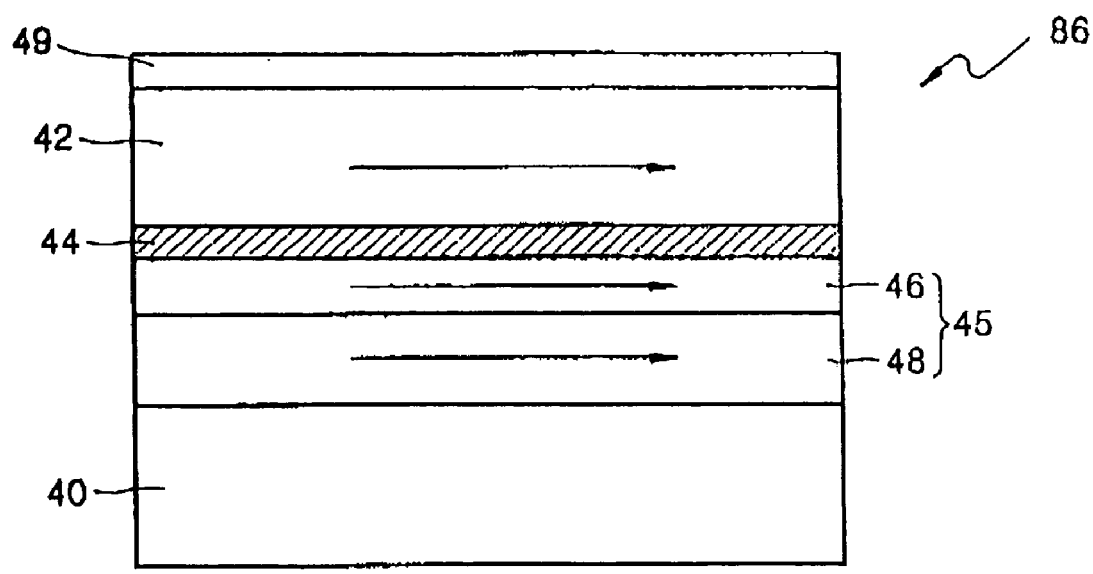
FIG. 25 illustrates a cross-sectional view of a MTJ layer in which magnetic films have the same magnetization direction on and under a tunneling film in the magnetic RAM of FIG. 24.
Figure 26:
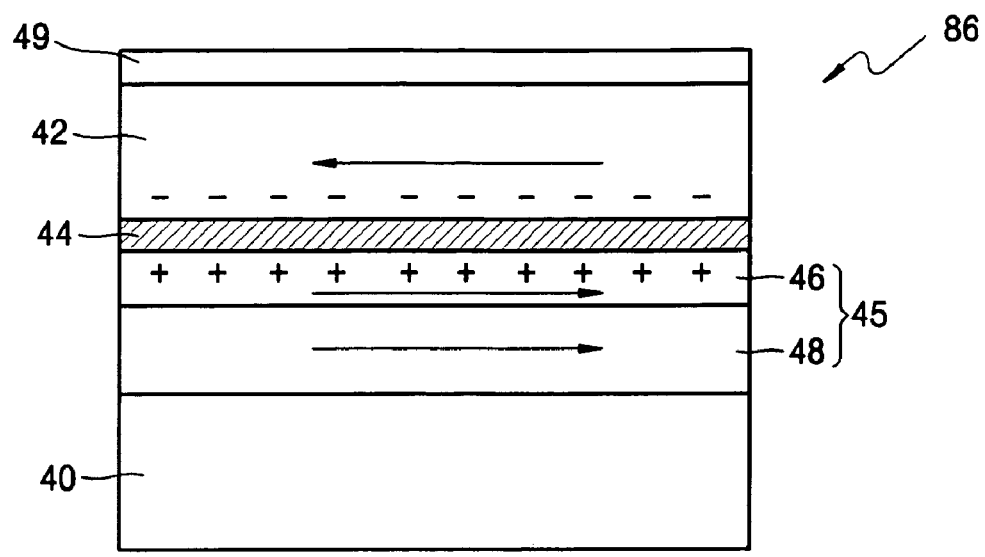
FIG. 26 illustrates a cross-sectional view of a MTJ layer in which magnetic films have opposite magnetization directions to each other on and under a tunneling film in the magnetic RAM of FIG. 25.

Referring to FIGS. 24-26, a current may be supplied to the digit line 77 and the bit line 92 in the given direction. At this time, a magnetic field is generated at the digit line 77 and the bit line 92. The magnetic field (hereinafter, referred to as "external magnetic field") causes the spin polarization of the electrons of the half-metal ferromagnetic film 42, which is the free layer of the MTJ layer 86, to be arranged in a direction of the external magnetic field. The result of the arrangement is illustrated with the half-metal ferromagnetic film 42 magnetized in the direction of the magnetic field.

FIG. 25 illustrates a cross-sectional view of a MTJ layer in which magnetic films have the same magnetization direction on and under a tunneling film in the magnetic RAM of FIG. 24. FIG. 26 illustrates a cross-sectional view of a MTJ layer in which magnetic films have opposite magnetization directions to each other on and under a tunneling film in the magnetic RAM of FIG. 25. That is, FIG. 25 illustrates an example in which the external magnetic field has the same magnetization direction as the first ferromagnetic film 46, while FIG. 26 illustrates an example in which the external magnetic field has the opposite magnetization direction to the first ferromagnetic film 46.

As illustrated in FIG. 25, in the example where the magnetization direction of the half-metal ferromagnetic film 42 is the same as that of the first ferromagnetic film 46 due to the external magnetic field, data "0" is recorded in the magnetic RAM. As illustrated in FIG. 26, in the example where the magnetization direction of the half-metal ferromagnetic film 42 is opposite to that of the first ferromagnetic film 46 due to the external magnetic field, data "1" is recorded in the magnetic RAM. Of course, data "0" and "1" may be recorded oppositely.

In the example where data "1" is recorded in the magnetic RAM, for the same reason described in the descriptions of the magnetic film structure 30 of FIG. 1, the positive charges (+) are collected at an interface of the first ferromagnetic film 46 contacting with the tunneling film 44 and the negative charges (−) are collected at an interface of the half-metal ferromagnetic film 42 contacting with the tunneling film 44. As a result, in the example where data "1" is recorded in the magnetic RAM, a potential difference is formed between the half-metal ferromagnetic film 42 and the first ferromagnetic film 46.

<Reading>

Where data "0" is recorded in the inventive magnetic RAM in a state shown in FIG. 25, a transistor is turned on and a resistance of the MTJ layer 86 may be measured to read data "0" recorded in the MTJ layer 86.

Where data "1" is recorded in the inventive magnetic RAM in a state shown in FIG. 26, data "1" may be read from the MTJ layer 86 by a number of methods, e.g., the resistance of the MTJ layer 86 may be measured, the shift voltage (i.e., the offset voltage) may be measured, or the current caused by the potential difference between the half-metal ferromagnetic film 42 and the first ferromagnetic film 46 may be measured.

In the example where data "1" is read in by measuring the current caused by the potential difference, the external magnetic field may be used to invert the magnetization direction of the half-metal ferromagnetic film 42 into the same direction as the first ferromagnetic film 46. Where the magnetization direction of the half-metal ferromagnetic film 42 is inverted into the same direction of the first ferromagnetic film 46, the charges collected at the interfaces of the half-metal ferromagnetic film 42 and the first ferromagnetic film 46 contacting with the tunneling film 44 flow through the transistor, which acts as a switching element. Therefore, the current may be sensed using a sensor amplifier connected to the second impurity region 74 of the transistor.

However, after data "1" is read by this method, the charges are all eliminated at the interfaces of the half-metal ferromagnetic film 42 and the first ferromagnetic film 46 with the tunneling film 44. Therefore, in order to maintain original data "1", the magnetization direction of the half-metal ferromagnetic film 42 may be inverted into the opposite magnetization direction to that of the first ferromagnetic film 46 after data "1" is read. This may be accomplished by inverting the direction of the external magnetic field.

<Erasing>

After the transistor of FIG. 24 is turned off, the magnetization directions of the half-metal ferromagnetic film 42 and the first ferromagnetic film 46 are allowed to be identical. That is, the magnetization direction of the half-metal ferromagnetic film 42 may be inverted to be the same as the magnetization direction of the first ferromagnetic film 46. The magnetization direction of the half-metal ferromagnetic film 42 may be inverted by the magnetic field generated from the bit line 92 and the digit line 77.

Figure 27:
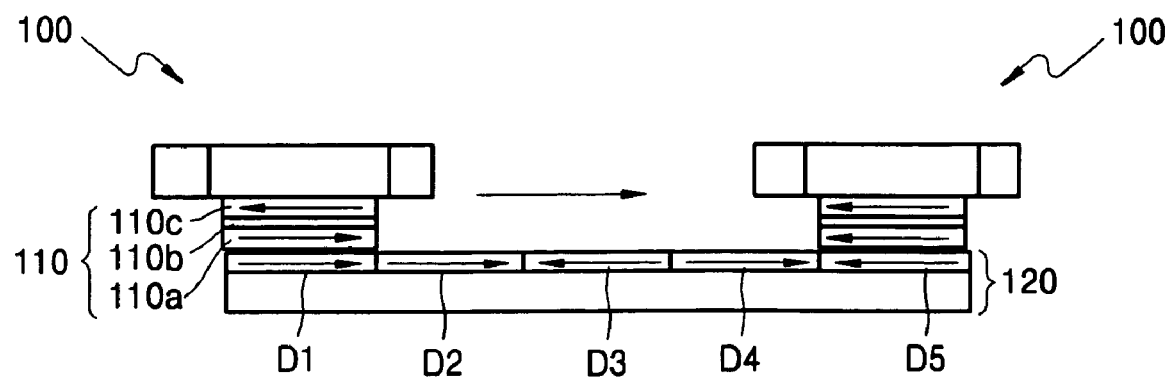
FIG. 27 illustrates a cross-sectional view of an example of the magnetic film structure of FIG. 1 used as a magnetic sensor.

The magnetic film structure 30 may be also applied to other semiconductor devices. For example, FIG. 27 illustrates a cross-sectional view of a magnetic film structure 30 used as a magnetic sensor 110 of a magnetic head 100. In FIG. 27, reference numeral 120 denotes a magnetic recording media and reference numerals D1-D5 denote domains of the magnetic recording media 120. Referring to FIG. 27, where the magnetic sensor 110 of the head 100 is proximal to the magnetic recording media 120, e.g., to read data from the magnetic recording media 120, the magnetization direction of the half-metal ferromagnetic film 110a of the magnetic sensor 110 may be influenced by the magnetization direction of the first to fifth domains (D1, . . . , D5) of the magnetic recording media 120.

For example, an initial magnetization direction of a half-metal ferromagnetic film 110a of the magnetic sensor 110 and the magnetization direction of a pinning film 110c point left on the drawing, and magnetization directions of the first to fifth domains D1-D5 point right, right, left, right and left, respectively. In this state, in the example where the magnetic sensor 110 is moved from the first domain D1 to the fifth domain D5, the magnetization direction of the half-metal ferromagnetic film 110a is inverted and points right on the first domain D1. Accordingly, the resistance of the magnetic sensor 110 is increased. The magnetization direction of the half-metal ferromagnetic film 110a is maintained, pointing to the right, on the second domain D2, and the magnetization direction of the half-metal ferromagnetic film 110a is inverted, pointing to the left, on the third domain D3. Accordingly, when the half-metal ferromagnetic film 110a is positioned on the third domain D3, the resistance of the magnetic sensor 110 is lowered. When the magnetic sensor 110 is positioned on the fourth domain D4, the magnetization direction of the half-metal ferromagnetic film 110a is inverted to point the right, which increases the resistance of the magnetic sensor 110. When the magnetic sensor 110 passes the fourth domain D4 and is positioned on the fifth domain D5, the magnetization direction of the half-metal ferromagnetic film 110a is inverted to point to the left and lower the resistance of the magnetic sensor 110. As such, the resistance of the magnetic sensor 110 may be different depending on the magnetization direction of each domain of the magnetic recording media 120. Therefore, this may be used to read a magnetization state of each domain of the magnetic recording media 120, i.e., data recorded in each domain of the magnetic recording media 120.

As described above, in the magnetic film structure 30, the charges are caused by the electrochemical potential difference of the two ferromagnetic films at facing surfaces of the two ferromagnetic films when the magnetization direction of the half-metal ferromagnetic film is opposite to the magnetization direction of the ferromagnetic film. The magnetization direction may be changed by the external magnetic field. The magnetization direction of the ferromagnetic film may be a predetermined direction. Accordingly, a potential difference may be formed between the two magnetic films, and the potential difference causes the current-voltage characteristic curve of the magnetic film structure to be shifted by a given value. That is, an offset voltage is observed in the current-voltage characteristic curve. Additionally, the magnetic resistance ratio of the magnetic film structure is rapidly increased at a periphery of the offset voltage.

Accordingly, according to the magnetic film structure 30, a high magnetic resistance ratio may be obtained at a low voltage. Where the magnetic film structure 30 is used for a semiconductor memory device, e.g., a magnetic RAM, power consumption may be not only reduced, but also data may be clearly and exactly read due to a high magnetic resistance ratio. Further, the magnetic film structure may have a smaller size. Therefore, a semiconductor device, e.g., a logic device, having the magnetic film structure 30 may have an increased degree of integration and reduced power consumption. Further, the magnetic film structure 30 may exhibit a potential difference, and the potential difference may be provided by changing the magnetization direction of the half-metal ferromagnetic film to be opposite to the magnetization direction of the ferromagnetic film. Therefore, the inventive magnetic film structure 30 may be integrated and used as a rechargeable battery. The magnetic film structure 30 of FIG. 1 or FIG. 20 may also be applied to a logic device, e.g., an inverter, etc. Further, a half-metal ferromagnetic film which has a semiconductor component other than silicon (Si), e.g., germanium (Ge), may be used and a half-metal ferromagnetic film, e.g., one which has copper (Cu) instead of cobalt, may be also used.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A multi-purpose magnetic film structure comprising:
   a lower magnetic film;
   a tunneling film on the lower magnetic film; and
   an upper magnetic film on the tunneling film,
   wherein the lower and upper magnetic films are ferromagnetic films forming an electrochemical potential difference therebetween when the lower and upper magnetic films have opposite magnetization directions.

2. The magnetic film structure as claimed in claim 1, wherein the upper magnetic film includes first and second ferromagnetic films on the tunneling film.

3. The magnetic film structure as claimed in claim 2, wherein a magnetization direction of the first ferromagnetic film is fixed in a direction by the second ferromagnetic film.

4. The magnetic film structure as claimed in claim 1, wherein the upper magnetic film is a half-metal ferromagnetic film, which is completely spin-polarized by a magnetic field.

5. The magnetic film structure as claimed in claim 1, further comprising a capping layer on the upper magnetic field.

6. The magnetic film structure as claimed in claim 1, wherein the lower magnetic film comprises:
   a first ferromagnetic film contacting the tunneling film; and
   a second ferromagnetic film under the first ferromagnetic film.

7. The magnetic film structure as claimed in claim 1, wherein the lower magnetic film is a half-metal ferromagnetic film, which is completely spin-polarized by the magnetic field.

8. The magnetic film structure as claimed in claim 1, further comprising a seed layer under the lower magnetic film.

9. The magnetic film structure as claimed in claim 1, having a size of less than 100 μm.

10. The magnetic film structure as claimed in claim 1, wherein the electrochemical potential difference causes electrons of the first ferromagnetic film, which are in a spin down state, to pass through the tunneling film and move to the lower magnetic film.

11. A semiconductor memory device comprising:
    a substrate;
    a switching element formed on the substrate; and
    a data storing unit connected to the switching element, the data storing unit comprising:
        a lower magnetic film;
        a tunneling film formed on the lower magnetic film; and
        an upper magnetic film formed on the tunneling film,
    wherein the lower and upper magnetic films are ferromagnetic films forming an electrochemical potential difference therebetween when the lower and upper magnetic films have opposite magnetization directions.

12. The device as claimed in claim 11, wherein at least one of the upper and lower magnetic films is a half-metal ferromagnetic film.

13. The device as claimed in claim 11, wherein the data storing unit has a size of less than 100 μm$^2$.

14. The device as claimed in claim 11, wherein the electrochemical potential difference causes electrons of the first ferromagnetic film, which are in a spin down state, to pass through the tunneling film and move to the lower magnetic film.

* * * * *